US012607927B2

(12) United States Patent
Lai et al.

(10) Patent No.: US 12,607,927 B2
(45) Date of Patent: Apr. 21, 2026

(54) PHOTOMASK AND METHOD FOR INSPECTING PHOTOMASK

(71) Applicant: TAIWAN SEMICONDUCTOR MANUFACTURING COMPANY LTD., Hsinchu (TW)

(72) Inventors: Chien-Hung Lai, Taichung City (TW); Hao-Ming Chang, Pingtung City (TW); Hsuan-Wen Wang, Kaohsiung City (TW); Ching-Ting Yang, Tainan City (TW); Cheng-Kuang Chen, Hsinchu (TW); Chien-Chao Huang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 244 days.

(21) Appl. No.: 17/191,537

(22) Filed: Mar. 3, 2021

(65) Prior Publication Data

US 2022/0283496 A1 Sep. 8, 2022

(51) Int. Cl.
| | |
|---|---|
| *G03F 1/84* | (2012.01) |
| *G03F 1/70* | (2012.01) |
| *G03F 1/76* | (2012.01) |
| *G03F 7/00* | (2006.01) |

(52) U.S. Cl.
CPC ................. *G03F 1/84* (2013.01); *G03F 1/70* (2013.01); *G03F 1/76* (2013.01); *G03F 7/7065* (2013.01)

(58) Field of Classification Search
CPC ..... G03F 1/84; G03F 1/70; G03F 1/76; G03F 7/7065
See application file for complete search history.

(56) References Cited

U.S. PATENT DOCUMENTS

| | | | |
|---|---|---|---|
| 8,762,900 B2 | 6/2014 | Shin et al. |
| 8,796,666 B1 | 8/2014 | Huang et al. |
| 8,812,999 B2 | 8/2014 | Liu et al. |
| 8,850,366 B2 | 9/2014 | Liu et al. |
| 8,906,595 B2 | 12/2014 | Liu et al. |
| 8,954,899 B2 | 2/2015 | Wu et al. |
| 9,093,530 B2 | 7/2015 | Huang et al. |
| 9,367,655 B2 | 6/2016 | Shih et al. |
| 9,390,217 B2 | 7/2016 | Wang et al. |
| 9,548,303 B2 | 1/2017 | Lee et al. |

(Continued)

FOREIGN PATENT DOCUMENTS

KR 100801745 B1 * 2/2008 ............... G03F 1/44

OTHER PUBLICATIONS

English machine translation of KR-100801745-B1 (Feb. 2008) (Year: 2008).*

(Continued)

*Primary Examiner* — Jonathan Johnson
*Assistant Examiner* — Jayson D Cosgrove
(74) *Attorney, Agent, or Firm* — WPAT LAW; Anthony King

(57) ABSTRACT

The present disclosure provides a photomask, including a plurality of pattern areas, each of the pattern areas is defined by a respective boundary, a first pattern area including a first mask feature, and a training area adjacent to a boundary of the pattern area, the training area comprising a first training feature, wherein the first training feature is comparable to the first mask feature.

20 Claims, 18 Drawing Sheets

(56)                    References Cited

U.S. PATENT DOCUMENTS

| | | | | |
|---|---|---|---|---|
| 2003/0073010 A1* | 4/2003 | Narukawa | G03F 1/84 | |
| | | | | 430/5 |
| 2008/0096113 A1* | 4/2008 | Naoe | G03F 1/84 | |
| | | | | 430/311 |
| 2012/0051621 A1* | 3/2012 | Ong | G03F 1/84 | |
| | | | | 382/144 |
| 2018/0335703 A1* | 11/2018 | Wang | G06F 30/392 | |
| 2019/0285980 A1* | 9/2019 | Yoshikawa | G03F 1/84 | |

OTHER PUBLICATIONS

W. Mauer et al., Process proximity correction using an automated software tool, SPIE vol. 3334 p. 245-253, 23rd Annual International Symposium on Microlithography, 1998, Santa Clara, CA, United States.

\* cited by examiner

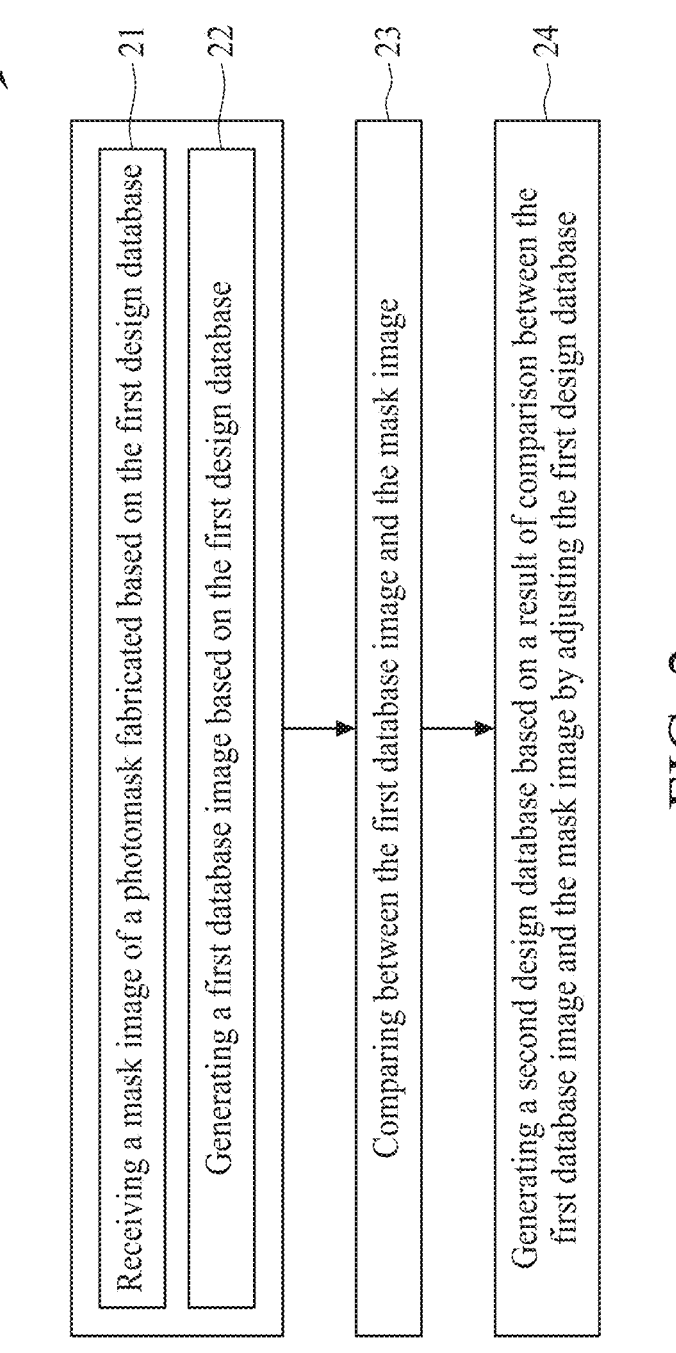

Receiving a mask image of a photomask fabricated based on the first design database Generating a first database image based on the first design database Comparing between the first database image and the mask image Generating a second design database based on a result of comparison between the first database image and the mask image by adjusting the first design database

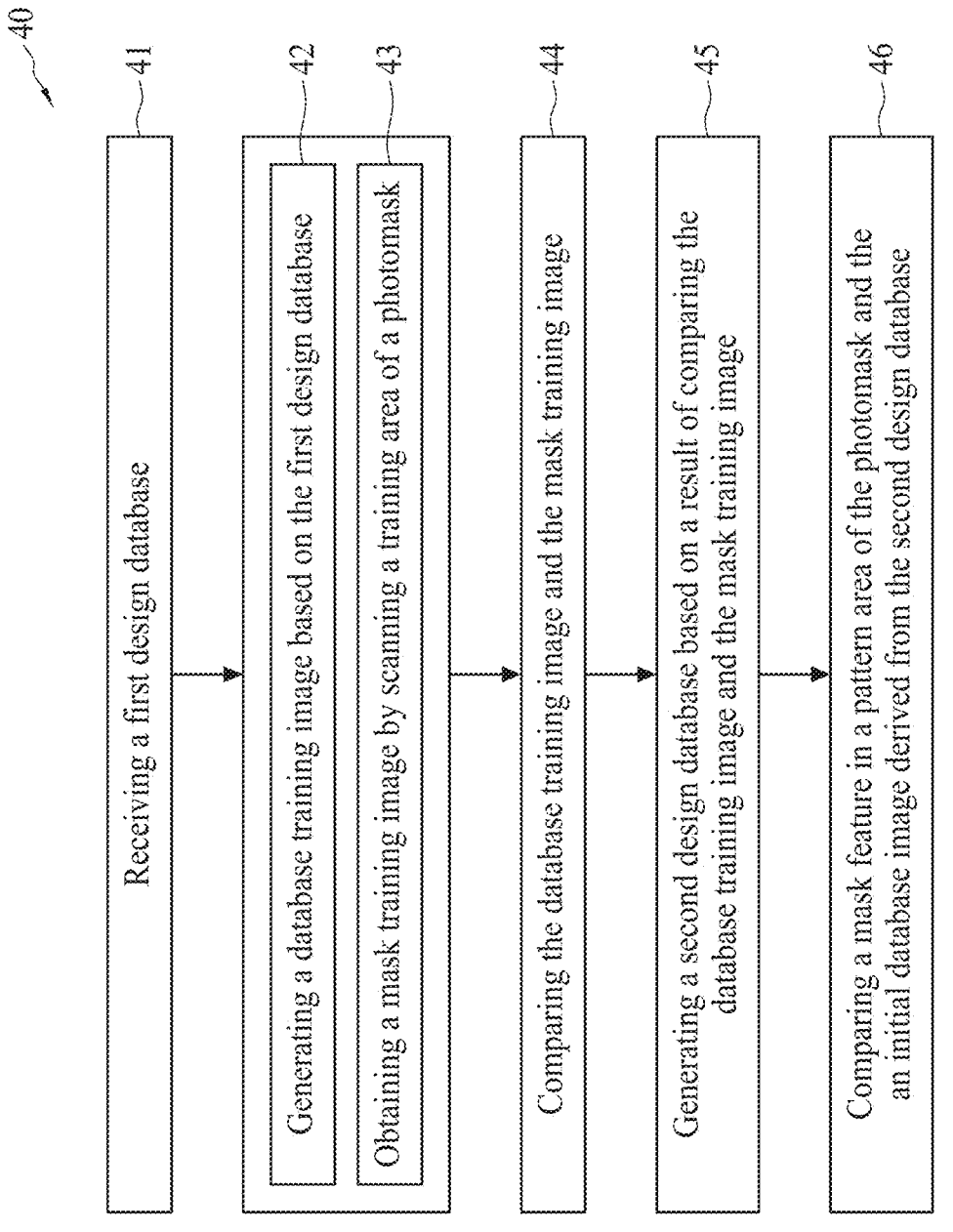

40

41 Receiving a first design database

42 Generating a database training image based on the first design database

43 Obtaining a mask training image by scanning a training area of a photomask

44 Comparing the database training image and the mask training image

45 Generating a second design database based on a result of comparing the database training image and the mask training image 46 Comparing a mask feature in a pattern area of the photomask and an initial database image derived from the second design database

FIG. 8B

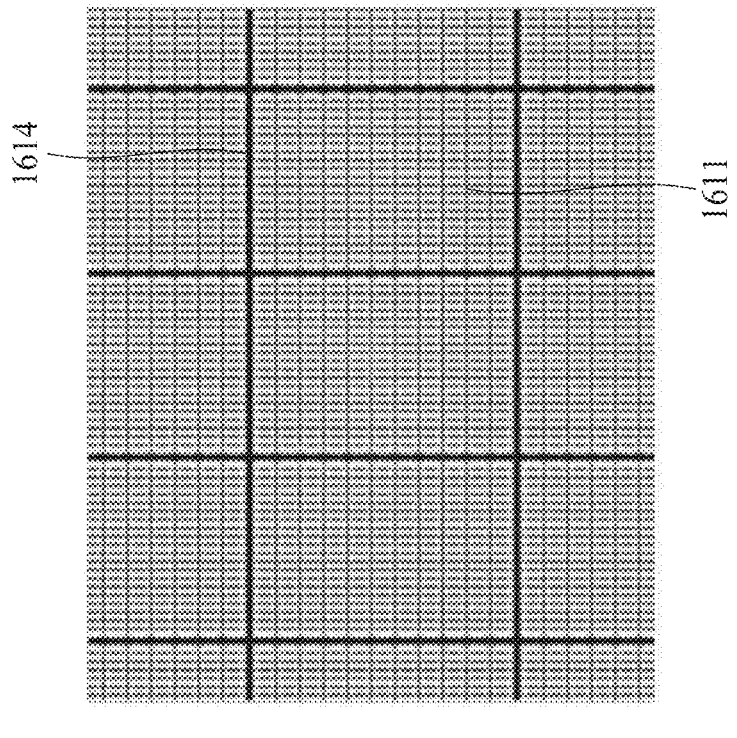
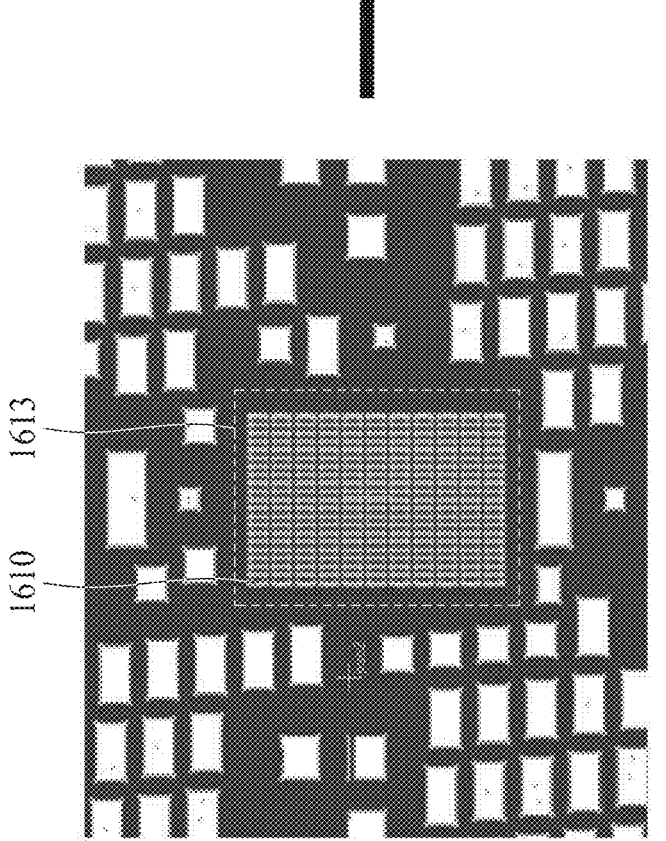
FIG. 16

PHOTOMASK AND METHOD FOR INSPECTING PHOTOMASK

BACKGROUND

An integrated circuit (IC) is formed by first generating an integrated circuit design that describes a physical layout of an integrated circuit on a computer. A photomask is then formed from the IC design. The photomask is used during IC fabrication to pattern a semiconductor substrate to form on-chip structures that correspond to the IC design. In the production of semiconductors, photolithography is performed using ultraviolet light sources or other radiation beams such as ion beams, x-ray, extreme ultraviolet (EUV), and deep ultraviolet (DUV). The photomask is usually inspected for mask defects before being used to replicate mask images on semiconductor substrates used in products. If mask defects are detected, such defects can be repaired so that the mask defects are not replicated on the semiconductor substrates.

However, as feature size shrinks, behaviors of light such as diffraction, fringing and interference become more significant. Along with the requirement of complicate design rules, the issue of falsely identified mask defects is aggravated. Reviewing the results of inspection and manually filtering defects to be repaired and defects falsely identified would cause heavy burden on labor force and deteriorate overall throughput.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 shows a flow chart representing method of inspecting a photomask, in accordance with some embodiments of the present disclosure.

FIG. 8B shows a flow chart representing method of inspecting a photomask, in accordance with some embodiments of the present disclosure.

FIG. 16 is a schematic drawing showing a feature in a pattern area and a feature of a training area corresponding thereto, according to some embodiments of the present disclosure.

DETAILED DESCRIPTION

Figure 1:
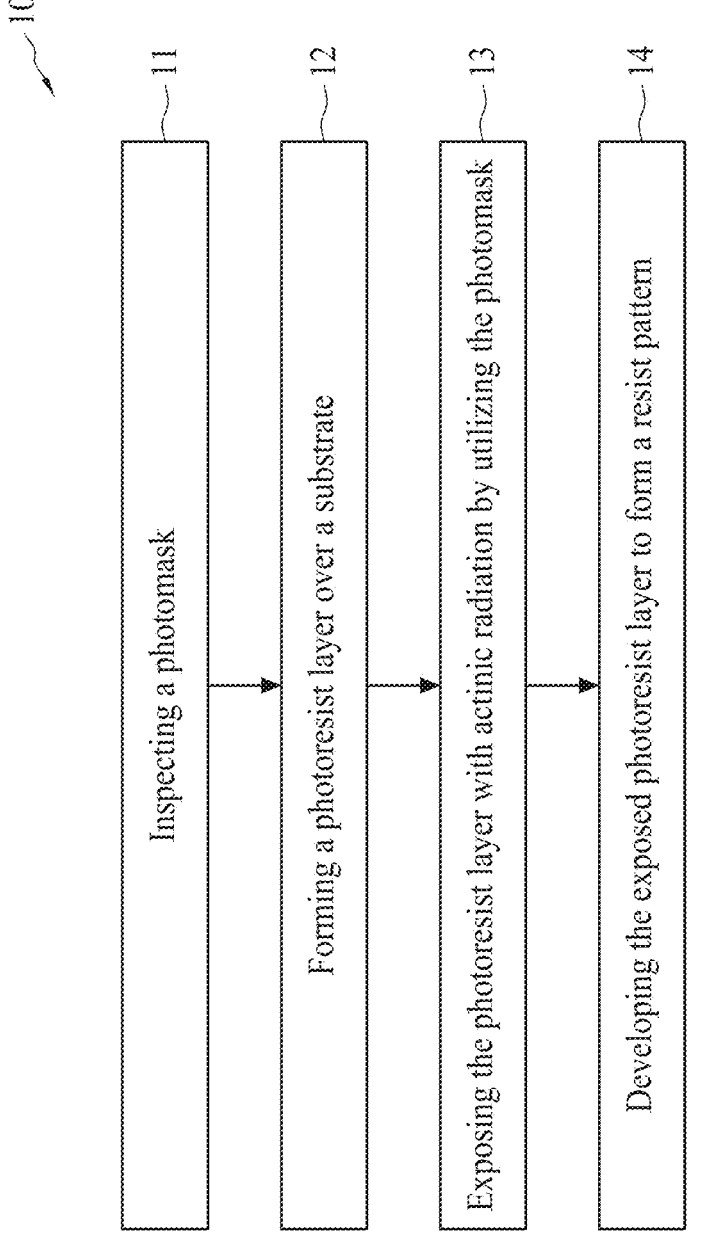
FIG. 1 shows a flow chart representing method of forming a semiconductor device by utilizing a photomask, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Referring to FIG. 1, FIG. 1 shows a flow chart representing method of forming a semiconductor device by utilizing a photomask, in accordance with some embodiments of the present disclosure. The method 10 for fabricating a semiconductor structure includes inspecting a photomask (operation 11), forming a photoresist layer over a substrate (operation 12), exposing the photoresist layer with actinic radiation by utilizing the photomask (operation 13), and developing the exposed photoresist layer to form a resist pattern (operation 14).

In order to reduce the defect of semiconductor devices formed by lithography operations, it is important to inspect the photomask prior to transferring the pattern of the photomask to an underlying photoresist layer utilizing photolithography operation. Undesired defects can be identified by inspection operations, wherein such defects can be repaired. However, due to the complicated design rule in the trend of minimizing device size, massive amount of falsely identified defects (i.e. false-positive defects) may be located by conventional inspection operations. However, such false-positive defects may actually be complied with desired design rule, but incorrectly identified due to complicated behaviors of light (such as diffraction, fringing and interference become more significant).

In order to improve the accuracy of mask inspection with regard to identifying defects to be repaired and eliminate defects falsely identified in a precautionary manner, the present disclosure provides a photomask, a method for inspecting a photomask, and a method for fabricating a photomask.

It should be noted that the present disclosure can be applied to various types of photomasks, such as attenuated phase-shift mask (AttPSM), super binary mask (SBIM), alternating phase-shift mask (AltPSM), binary mask, EUV mask, DUV mask, or other types of optical masks. The inspection operations can be performed during the operations of manufacturing the photomasks, after fabricating the photomasks, or before performing a lithography operation with the photomask.

Referring to FIG. 2, FIG. 2 shows a flow chart representing method of inspecting a photomask, in accordance with some embodiments of the present disclosure. The method 20 for inspecting a photomask includes receiving a mask image of a photomask fabricated based on the first design database (operation 21, which can be referred to FIG. 3 to FIG. 4), generating a first database image based on the first design database (operation 22, which can be referred to FIG. 3 to FIG. 4), comparing between the first database image and the mask image (operation 23, which can be referred to FIG. 4 and FIG. 7), and generating a second design database based on a result of comparison between the first database image and the mask image by adjusting the first design database (operation 24, which can be referred to FIG. 4).

Figure 3:
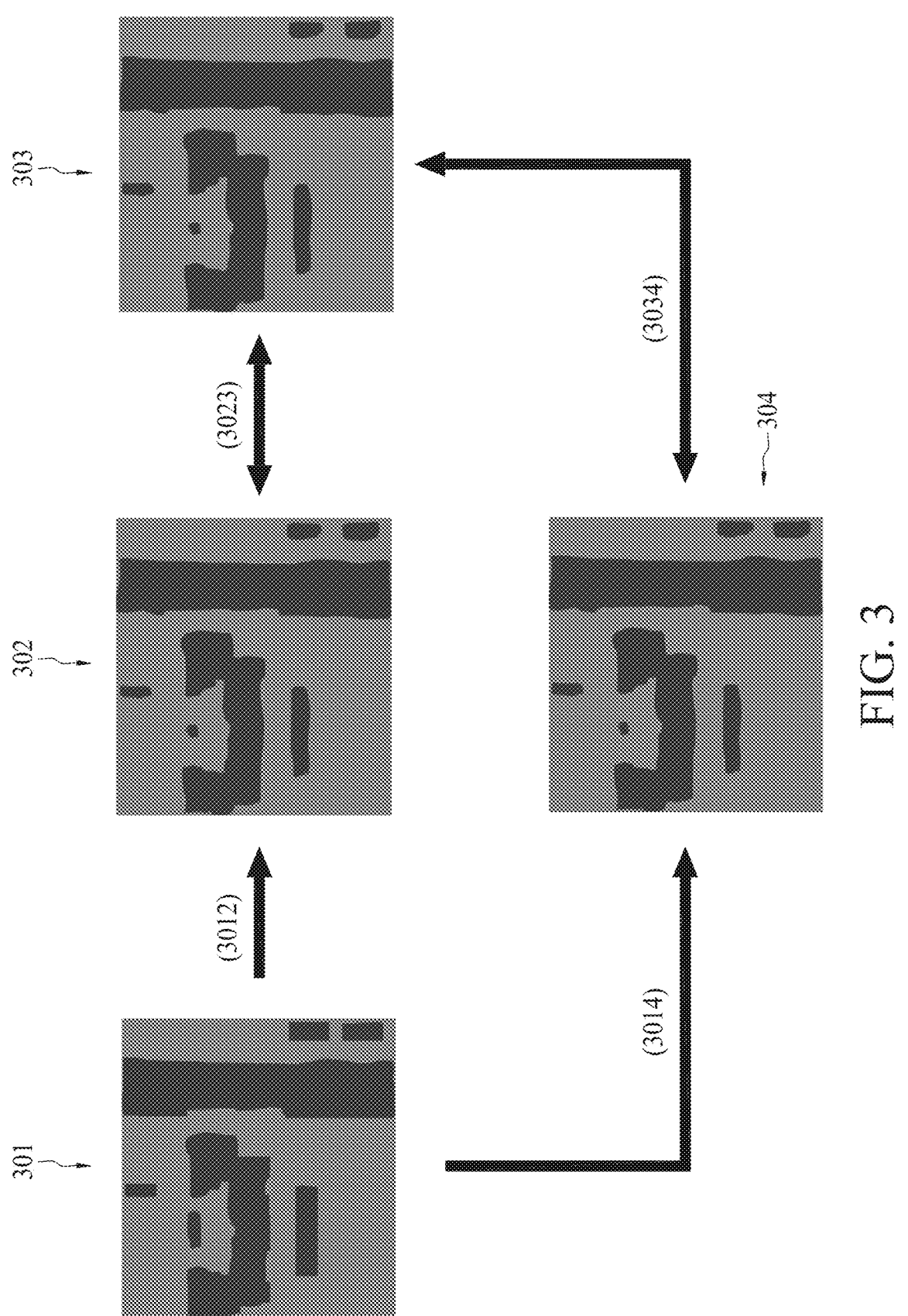
FIG. 3 shows a flow diagram of inspecting a photomask, in accordance with some embodiments of the present disclosure.
Figure 4:
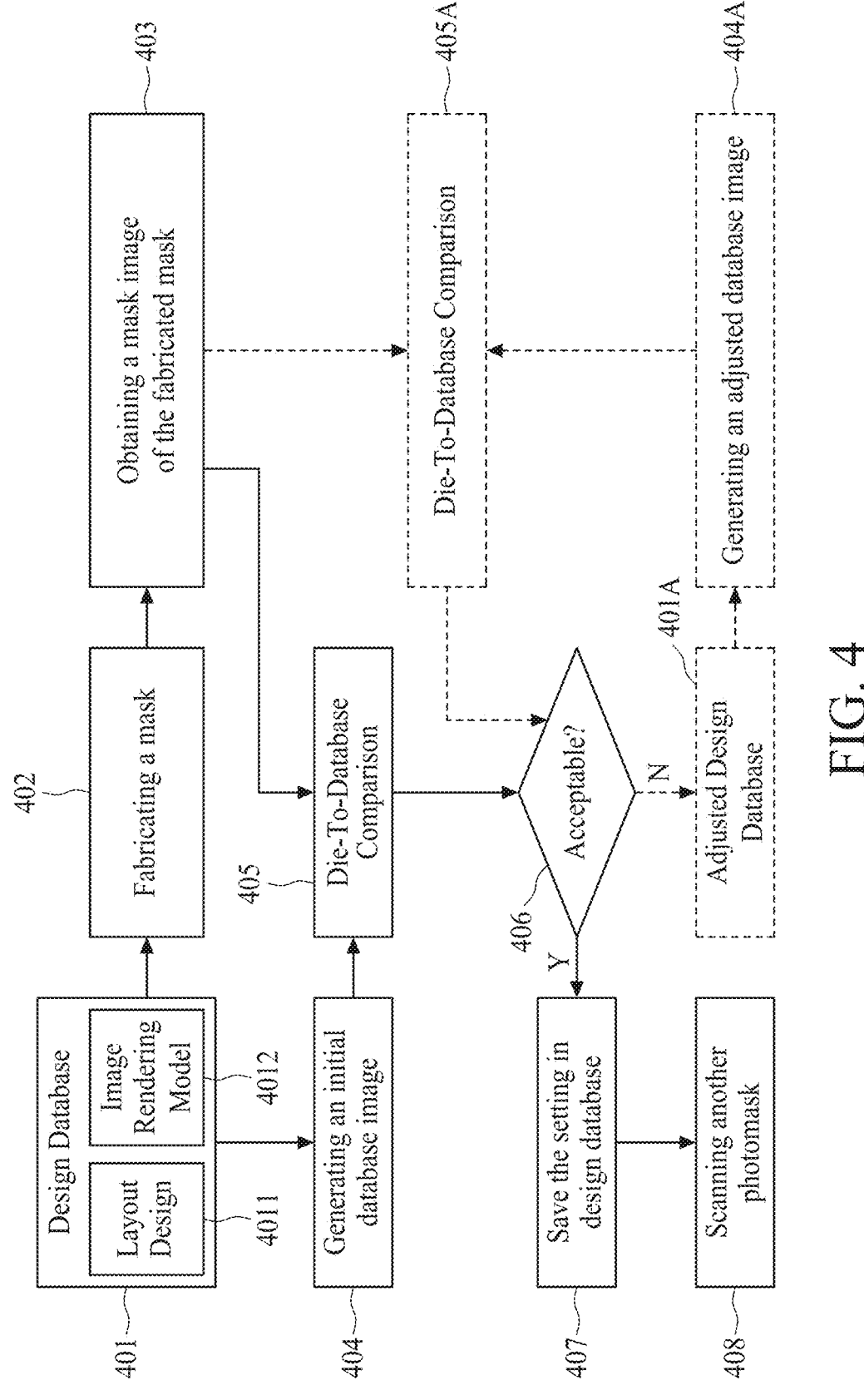
FIG. 4 shows a block diagram of a system for performing inspection on a photomask, in accordance with some embodiments of the present disclosure.

Referring to FIG. 3 and FIG. 4, FIG. 3 shows a flow diagram of inspecting a photomask, and FIG. 4 shows a block diagram of a system for performing inspection on a photomask, in accordance with some embodiments of the present disclosure. In some embodiments, a photomask 500 (a physical photomask) in FIG. 5 is fabricated based on a design database 401 of the system 400 illustrated in FIG. 4.

Referring to FIG. 3, FIG. 3 provides a flow diagram of a method for inspecting a photomask, the method including generating an initial database image 302 based on a layout design 301 (shown by a single ended arrow 3012), and comparing the generated initial database image 302 to a mask image 303 (shown by a double ended arrow 3023). The mask image 303 may be obtained by capturing or scanning a sampled portion of a physical photomask. Details for comparing an initial database image 302 and a mask image 303 will be subsequently discussed in FIG. 7. In some embodiments, an adjusted database image 304 may be generated (shown by a single ended arrow 3014) based on a result of the comparison between the initial database image 302 and the mask image 303. For example, a rendering model for generating an adjusted database image 304 based on a layout design 301 may be updated accordingly. Further, the adjusted database image 304 can be compared to mask image 303 (shown by a double ended arrow 3034) so the rendering model can be optimized, and false-positive defects may be decreased. In some of the embodiments, the comparison can be partially or completely implemented by an operator, and the identification of false-positive defects requiring operator's review can be decreased.

Figure 5:
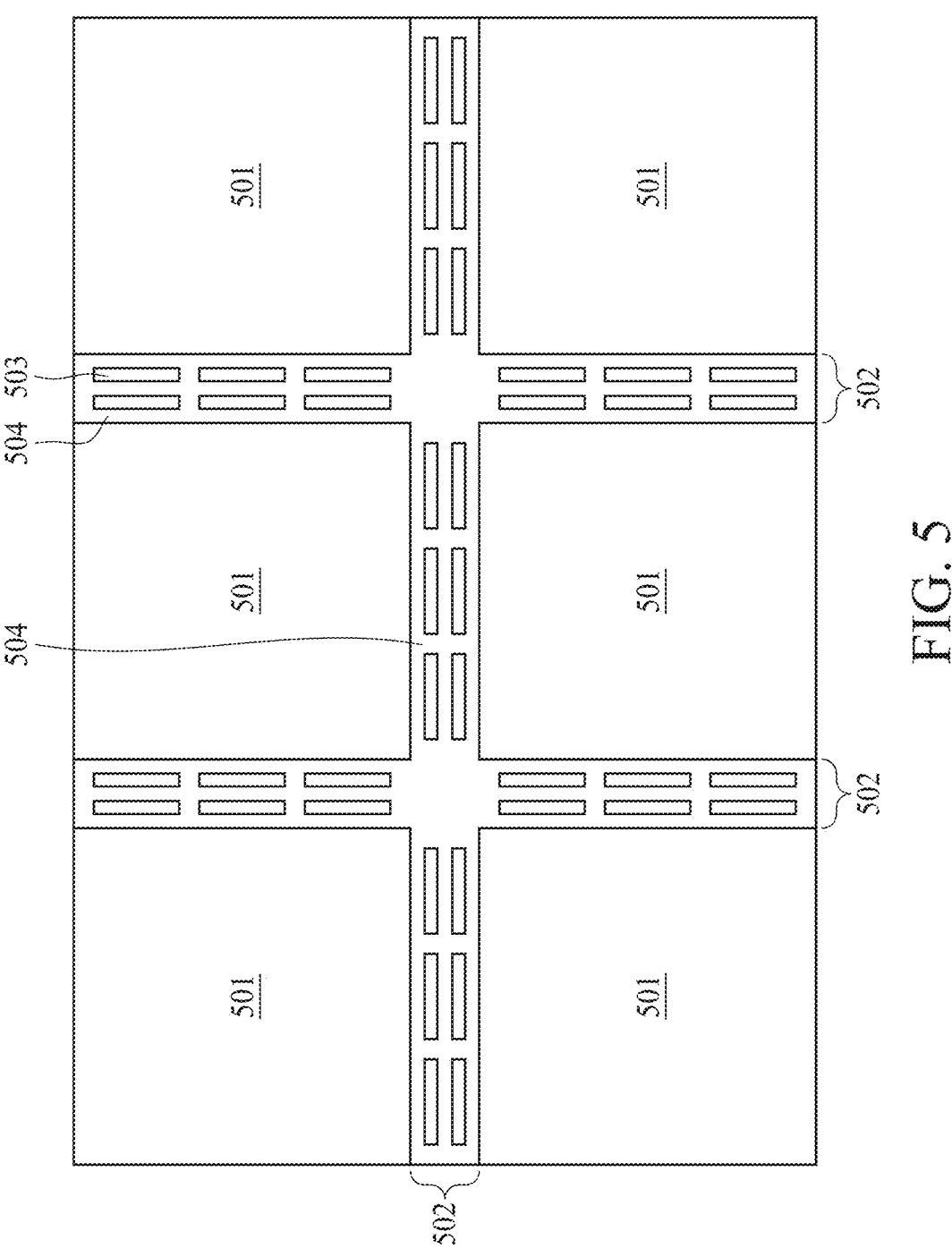
FIG. 5 is a schematic drawing showing a patterned surface of a photomask and an enlarged view of dummy patterns on the photomask, according to some embodiments of the present disclosure.

FIG. 5 is schematic drawing showing a patterned surface of a photomask and an enlarged view of dummy patterns on the photomask, according to some embodiments of the present disclosure. The photomask 500 may include a substrate, an absorption layer, and/or one or more attenuating layers. The substrate may include fused silica, fused quartz, calcium fluoride, and/or other suitable material. The absorption layer may include chromium, MoSi, and/or other suitable materials. Typically, the mask pattern corresponding to a layout design 4011 of the design database 401 (shown in FIG. 4) is etched into the absorption layer. This may be done using a mask writing technique such as electron beam writing, ion beam writing, etching such as wet or dry etching, or using an alternative mask writing technique. Attenuating layers may be formed that include such materials as metal silicide, metal nitride, iron oxide, inorganic material and/or other suitable materials. The photomask 500 may further include one or more reflective layers. These reflective layers may be created using materials such as silicon/molybdenum, molybdenum/beryllium, and/or other suitable materials.

The photomask 500 may include a plurality of pattern areas 501, wherein each of the pattern areas 501 may be separated and defined by a boundary 504. In some embodiments, the pattern areas 501 are separated by an in-frame region 502, wherein the in-frame region 502 can be transferred to an area of an underlying substrate or wafer in a lithography operation, and the area can be utilized as a scribe line area where dicing operation can be performed along with the scribe lines. In some embodiments, dummy patterns 503 can be disposed in the in-frame region 502 in order to reduce local diffraction.

Referring to FIG. 4, the design database 401 contains data files of sets or subsets of geometric patterns. Such geometric patterns can be stored in a layout description language such as Graphic Database System (GDS), GDS-II, Caltech Intermediate Format (CIF), Oasis file, or the like. In some embodiments, the system 400 can be implemented by computer system or software such that the foregoing methods disclosed therein can be automatically performed. For a given computer, the software routines can be stored on a storage device, such as a permanent memory. Alternately, the software routines can be machine executable instructions stored using any machine readable storage medium, such as a diskette, CD-ROM, magnetic tape, digital video or versatile disk (DVD), laser disk, ROM, flash memory, etc. The series of instructions could be received from a remote storage device, such as a server on a network. The present invention can also be implemented in hardware systems, discrete hardware or firmware.

In some embodiments, a mask for training the design database is fabricated (operation 402 as shown in FIG. 4). In some embodiments, at least a portion of such mask is verified after fabrication. Verification may be performed by one or more of a variety of techniques including direct inspection, measuring the transmission or reflection of an electron beam, test printing on a light-sensitive medium, or other verification technique. The verification system may include an electronic microscope, a wafer test system, a chip test system, and/or other systems for verifying a mask or a semiconductor device.

Figure 6:
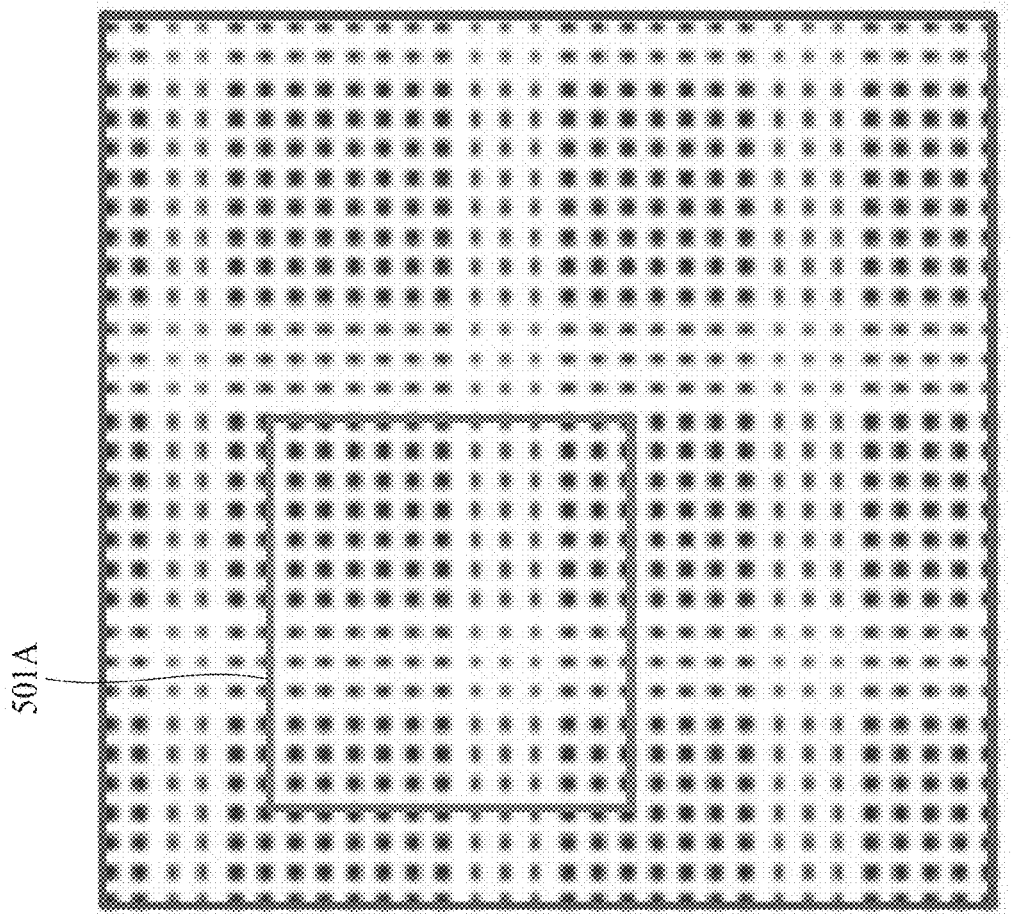
FIG. 6 is a schematic drawing showing a patterned surface of a photomask and a size of an inspection area, according to some embodiments of the present disclosure.

Referring to FIG. 3 to FIG. 6, FIG. 5 is a schematic drawing showing a patterned surface of a photomask, and FIG. 6 is an enlarged view showing a pattern area 501 illustrated in FIG. 5, according to some embodiments of the present disclosure. In some embodiments, at least a portion of the photomask 500 (shown in FIG. 5) can be sampled by utilizing optical based system, that is, a mask image 303 of FIG. 3 can be obtained by capturing the image or scanning (e.g. by laser) the sampled portion of the photomask 500 (operation 403 as shown in FIG. 4). In some embodiments, a portion of the photomask 500 may be verified prior to the capturing of the mask image 303. Alternatively stated, the mask image 303 of FIG. 3 is generated based on a portion of the photomask 500 (shown in FIG. 5) that is verified. The mask image 303 of FIG. 3 can serve as a baseline of pre-swath calibration for adjusting the design database 401, as will be discussed subsequently. In some embodiments, a captured area 501A (shown in FIG. 6) of the photomask 500 has a size smaller than an area of the pattern area 501.

The design database 401 of the system 400 (as shown in FIG. 4) further includes an image rendering model 4012 (as shown in FIG. 4) that can read in a layout design 4011 from the data file of design database 401 and simulate an imaginary mask creation based on the layout design 301 (as shown in FIG. 3). The image rendering model 4012 simulates how a corresponding mask would appear when viewed by a mask imaging tool and generates an initial database image 302 of FIG. 3 (operation 404 as shown in FIG. 4). For example, the image rendering model 4012 may include a model that calculates the effects that may occur to the radiation during an exposure operation. A calibration operation (which can be referred to as pre-swath calibration) is performed to calibrate the design database 401. The pre-swath calibration operation can be done by utilizing die to database comparison (operation 405 as shown in FIG. 4) that is able to identify differences between corresponding area(s) of the initial database image 302 and the mask image 303.

Referring back to FIG. 3, as previously discussed, since the behaviors of light such as diffraction, fringing and interference become more significant, it becomes more and more difficult to directly simulate light behaviors based on old data or past experience. The challenge of image rendering especially increases in advanced technology nodes, since photomask design is more complicated owing to the aggressive optical proximity correction (OPC), inverse lithography technology (ILT), and/or source mask optimization (SMO). The tiny jogs and complex features on the photomasks cause tens of thousands of nuisance defects which are reviewed and dispositioned by manpower. Some differences between corresponding area(s) of the initial database image 302 and the mask image 303 may be stem from the image rendering model at certain generation that does not accurately simulate complicated patterns of the layout design under complicated or updated design rules. If the design database that generates database images for inspection is not modified to align with the mask image that reflects complicate light behavior, such differences between the database image and mask image may be remained. When performing photomask inspection based on the unmodified design database, massive amount of falsely identified defects (i.e. false-positive defects) may be located. Such falsely identified defects are known as false-positive defects, and in some cases, thousands or even more falsely identified defects may be identified by an unadjusted design database in a region of a substrate. It is difficult to manually review each and every defects identified and accurately categorize the defects especially when such false-positive defects outnumber real defects in some circumstances.

Figure 7:
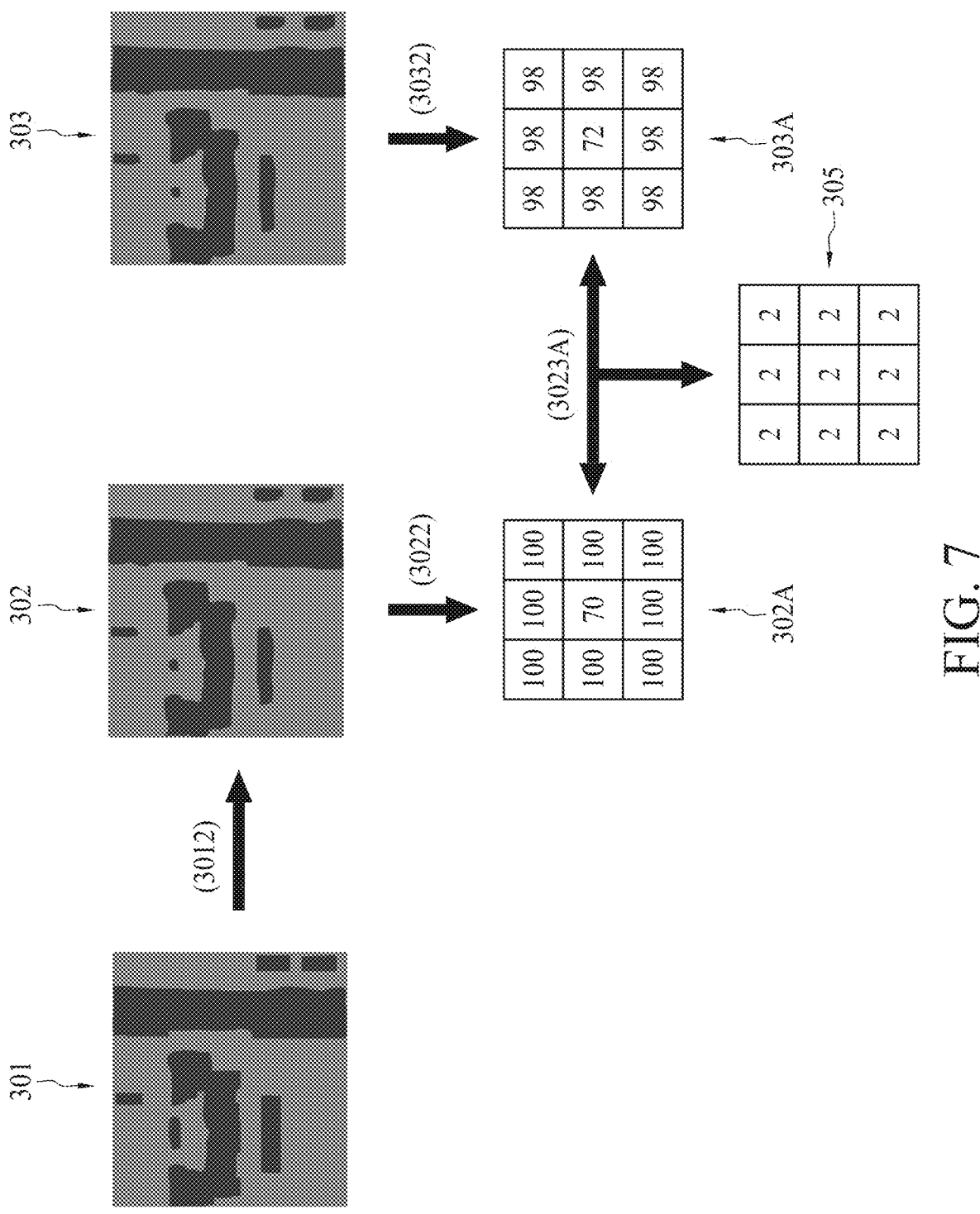
FIG. 7 shows a flow diagram of comparing a database image and a mask image, in accordance with some embodiments of the present disclosure.

Referring to FIG. 3, FIG. 4 and FIG. 7, FIG. 7 shows a flow diagram of comparing a database image and a mask image, in accordance with some embodiments of the present disclosure. FIG. 7 provides an embodiment of a method of comparing between a mask image 303 and the initial database image 302 as discussed in FIG. 3 (in some cases, the method may be a part of the die-to-database comparison 405 mentioned in FIG. 4). The initial database image 302 is converted into a first gray scale mapping 302A (shown by a single ended arrow 3022), and the mask image 303 is converted into a second gray scale mapping 303A (shown by a single ended arrow 3032). In the present disclosure, a gray scale mapping is referred to as a grayscale bitmap or raster image, which includes a plurality of mapping pixels, and each pixel has a grayscale value in a certain range (such as from 0 to 255, or −255 to 255) that represent local brightness of a pixel. A comparison mapping 305 can be generated based on a result of comparison between the first gray scale mapping 302A and the second gray scale mapping 303A (shown by a double ended arrow 3023A), for example, mapping out a matrix of an absolute value of difference between the grayscale values of each corresponding pixels of the first gray scale mapping 302A and the second gray scale mapping 303A. In the example provided in FIG. 7, each pixel value of the comparison mapping 305 in the sequence of top third, middle third and bottom third, from left to right has a value of: |100−98|=2, |100−98|=2, |100−98|=2, |100−98|=2, |70−72|=2, |100−98|=2, |100−98|=2,

|100−98|=2, |100−98|=2. The comparison mapping 305 can serve as an indication of similarity between the first gray scale mapping 302A and the second gray scale mapping 303A, and may also serve as an indication of similarity between the initial database image 302 and the mask image 303. When at least a portion among all pixels in the comparison mapping 305 has a value less than a threshold value, then two compared gray scale mappings can be deemed similar and the initial database image 302 can be deemed passable.

Therefore, as shown in FIG. 4, a pass/fail determination operator 406 performs a determination operation to assess the similarity between the initial database image 302 and the mask image 303. For example, when 90% or more of the pixels of the comparison mapping 305 has a value less than 50 on the 0 to 255 scale, the two compared images can be deemed similar or acceptable (the design database 401 being deemed passable) by the pass/fail determination operator 406 (Y path). It should be noted that the threshold value and the scale is not limited thereto in the present disclosure.

On the other hand, when two gray scale mappings are deemed not similar or failed (e.g. less than 90% of the pixels of the comparison mapping 305 has a value less than 50 in the 0 to 255 scale) by the pass/fail determination operator 406 (N path), the image rendering model 4012 of the design database 401 would then be adjusted in order to generate an adjusted database image 304 (operation 404A) based on the initial database image 302. Subsequently, the adjusted database image 304 can be further compared to the mask image 303 (operation 405A). A new grayscale mapping (not shown) of the adjusted database image 304 is generated and compared to the second gray scale mapping 303A. The pass/fail determination operator 406 decides whether the mask image 303 and the adjusted database image 304 are similar or substantially aligned.

When the mask image 303 and the initial database image 302 are deemed similar by the pass/fail determination operator 406 (shown in FIG. 4), the design database 401 (shown in FIG. 4) is accepted and saved. When the mask image 303 and the initial database image 302 are not deemed similar by the pass/fail determination operator 406, the design database 401 would then be adjusted as adjusted design database 401A (shown in FIG. 4), and the adjusted design database 401A can generate an adjusted database image 304 that is different from the initial database image 302 and may be more similar to the mask image 303. In some embodiments, the operations of generating an adjusted database image 304 and comparing the updated ones with the mask image 303 can be performed repeatedly until the adjusted database image 304 is deemed similar to the mask image 303. In operation 407 (shown in FIG. 4), the settings with regard to the updated adjusted database image 304 (or the initial database image 302 if no adjustment was made) and/or the image rendering model is saved in the adjusted design database 401A (or the design database 401 if no adjustment was made). In some embodiments, the adjustment of the design database after pass/fail determination can be implemented by the operator, or manually. Upon such review and the updating of the image rendering model, the false-positive defect being identified during the die-to-database comparison may be effectively decreased and no longer be deemed as a defect in similar fabrication and inspection operation. By virtue of such feedback and the optimization of the image rendering model, it may be able to decrease the proportion of the false-positive defect among all false counts identified, alleviate the time consumed by operator's review, and increase the accuracy of identifying the real defects.

Specifically, by performing the aforesaid pre-swath calibration operation, the aforesaid system 400 (shown in FIG. 4) may, as a precaution, help eliminating potential falsely identified defects that are generated due to the limitation of the ability of the image rendering model 4012 (shown in FIG. 4). The adjusted design database 401A (or the design database 401) saved after pre-swath calibration operation is utilized to generate an adjusted database image 304 that is similar to or aligned with the mask image 303 of the photomask 500, wherein the adjusted database image 304 can be utilized in performing mask inspection (which can be laser based, electron beam based, near-infrared microscope, optical microscope, or the like, or alternatively by manual review) on photomasks similar to photomask 500 (shown in FIG. 5). The remaining defects in further mask inspection that require further review can be reduced since it may take less time on identifying every similar falsely identified defects. Accordingly, it may be easier to identify the real defects from falsely identified defects. In operation 408 (shown in FIG. 4), the saved design database 401 (or adjusted design database 401A) can be applied to the operations of fabricating substantially identical masks (or masks having similar subsets) for batch production, thus may be able to improve the efficiency of manufacturing.

In some embodiments, in order to further provide a more sophisticated system for identifying falsely identified defects, a system 900 is provided, which will be discussed in FIG. 8A to FIG. 17. The system 900 can be executed on computer system or software similar to system 400 discussed in FIG. 4. In the embodiment(s) previously discussed in FIG. 3 to FIG. 7, it may still require operator's review, or manual review described herein, on identifying false-positive defects and real defects due to the change of design rule. As for the embodiments discussed in FIG. 8A to FIG. 17, the training of rendering model corresponding to more advanced/complicated patterns can be preliminarily implemented and saved in a library. The latter operation described in FIG. 8A to FIG. 17 may allow a foundry to establish a library of various advanced mask patterns beforehand for adapting new design rules under new generations within a shorter time frame. The embodiments discussed in FIG. 8A to FIG. 17 may further decrease or eliminate operator's review.

Figure 8A:
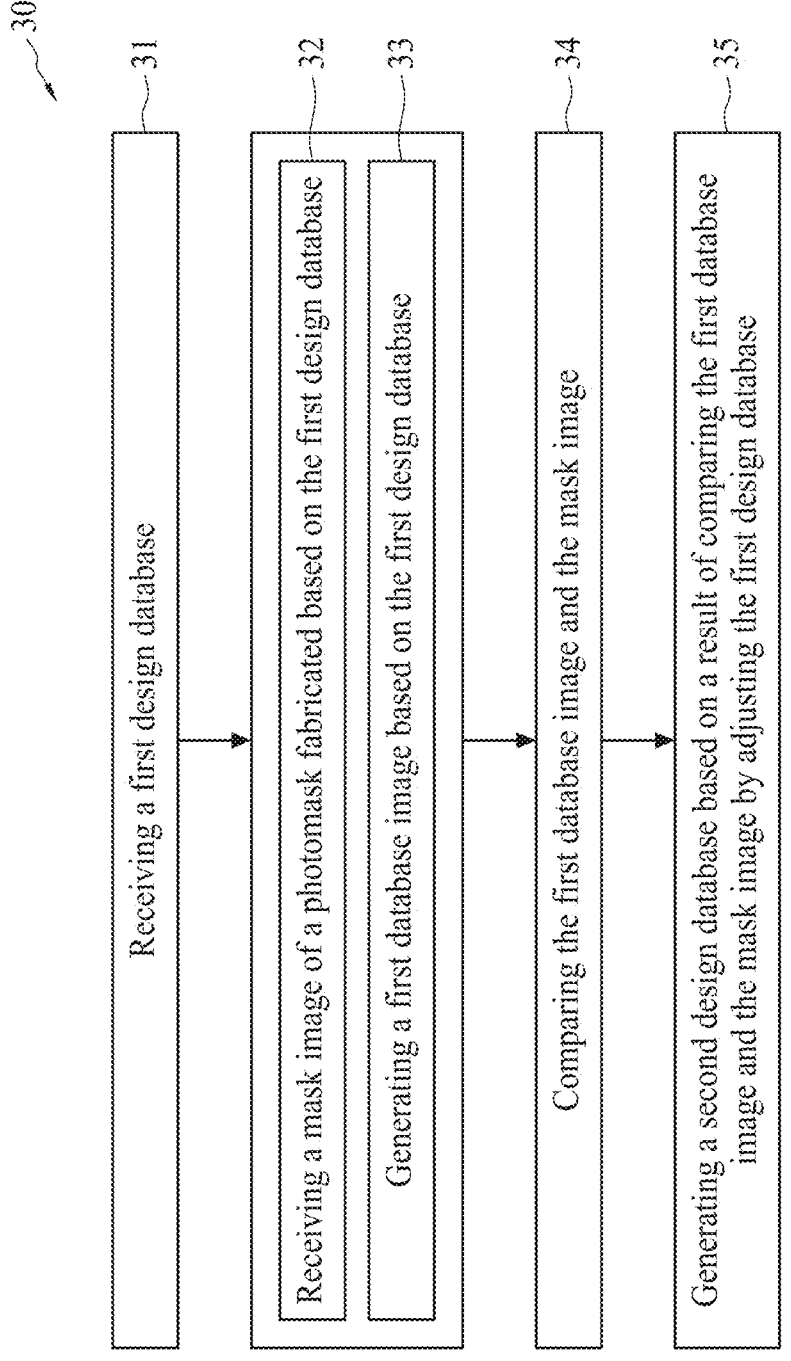
FIG. 8A shows a flow chart representing method of inspecting a photomask, in accordance with some embodiments of the present disclosure.

Referring to FIG. 8A, FIG. 8A shows a flow chart representing method of inspecting a photomask, in accordance with some embodiments of the present disclosure. The method 30 for inspecting a photomask includes receiving a first design database (operation 31, which can be referred to FIG. 9), receiving a mask image of a photomask fabricated based on the first design database (operation 32, which can be referred to FIG. 9), generating a first database image based on the first design database (operation 33, which can be referred to FIG. 9), comparing the first database image and the mask image (operation 34, which can be referred to FIG. 9 and FIG. 14), generating a second design database based on a result of comparing the first database image and the mask image by adjusting the first design database (operation 35, which can be referred to FIG. 9 and FIG. 10).

Referring to FIG. 8B, FIG. 8B shows a flow chart representing method of inspecting a photomask, in accordance with some embodiments of the present disclosure. The method 40 for inspecting a photomask includes receiving a first design database (operation 41, which can be referred to FIG. 9), generating a database training image based on the first design database (operation 42, which can be referred to FIG. 9), obtaining a mask training image by scanning a training area of a photomask (operation 43, which can be referred to FIG. 9), comparing the database training image and the mask training image (operation 44, which can be referred to FIG. 9 and FIG. 17), generating a second design database based on a result of comparing the database training image and the mask training image (operation 45, which can be referred to FIG. 9) and comparing a mask feature in a pattern area of the photomask and the an initial database image derived from the second design database (operation 46, which can be referred to FIG. 9 and FIG. 10).

Since complicated light behavior may be occurred at an area having complicated pattern, or patterns that is designed under new rules, it may be possible to preliminarily predict possible patterns that may cause the current image rendering model to fall short on rendering accurately. By performing a calibration operation (which can be referred to as designed pre-swath calibration, as will be discussed in FIG. 9 to FIG. 17), the accuracy of preliminarily eliminating the falsely identified defects can further be enhanced.

Figure 9:
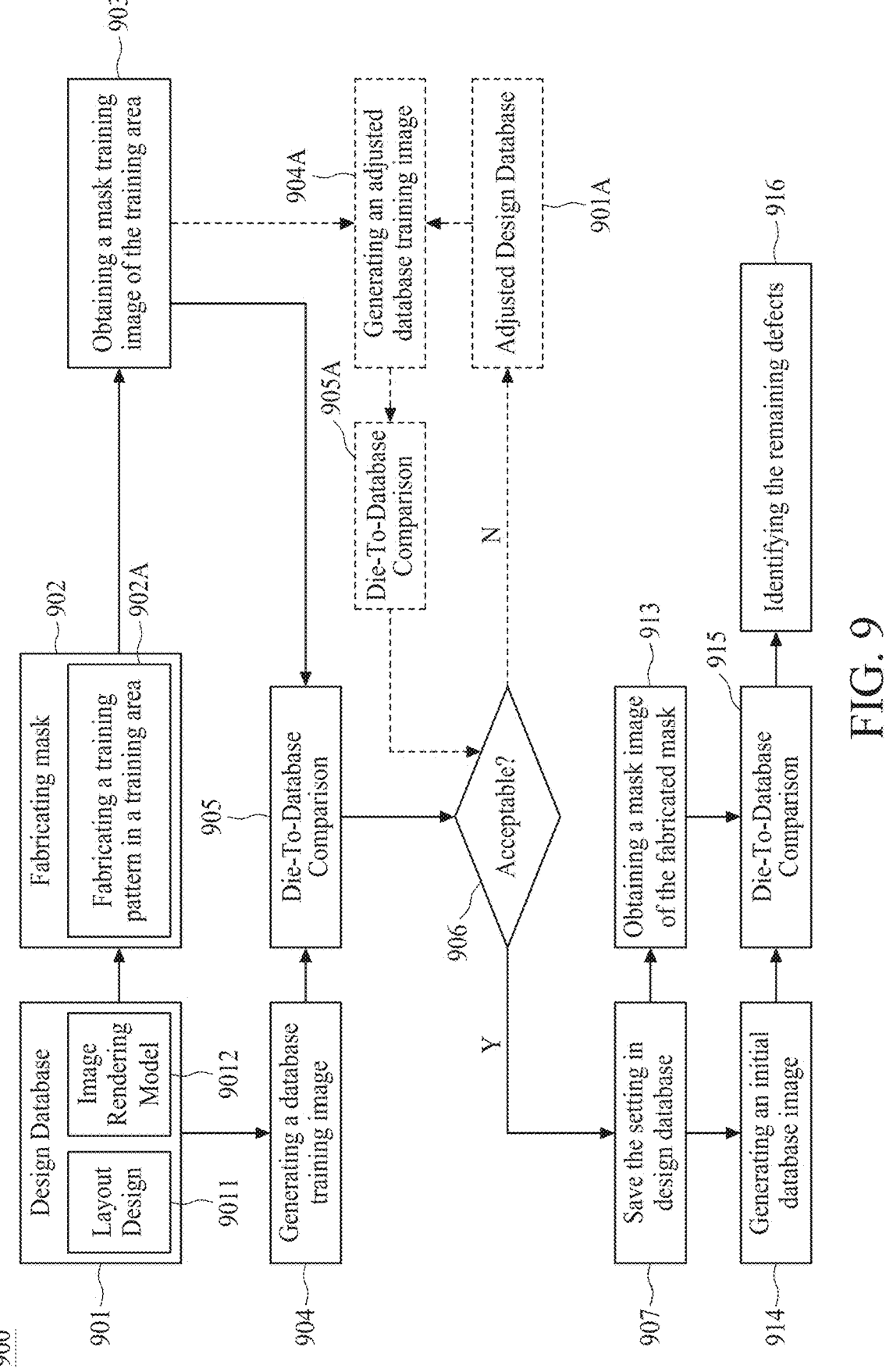
FIG. 9 shows a block diagram of a system for fabricating a photomask and performing an inspection on the photomask, in accordance with some embodiments of the present disclosure.
Figure 10:
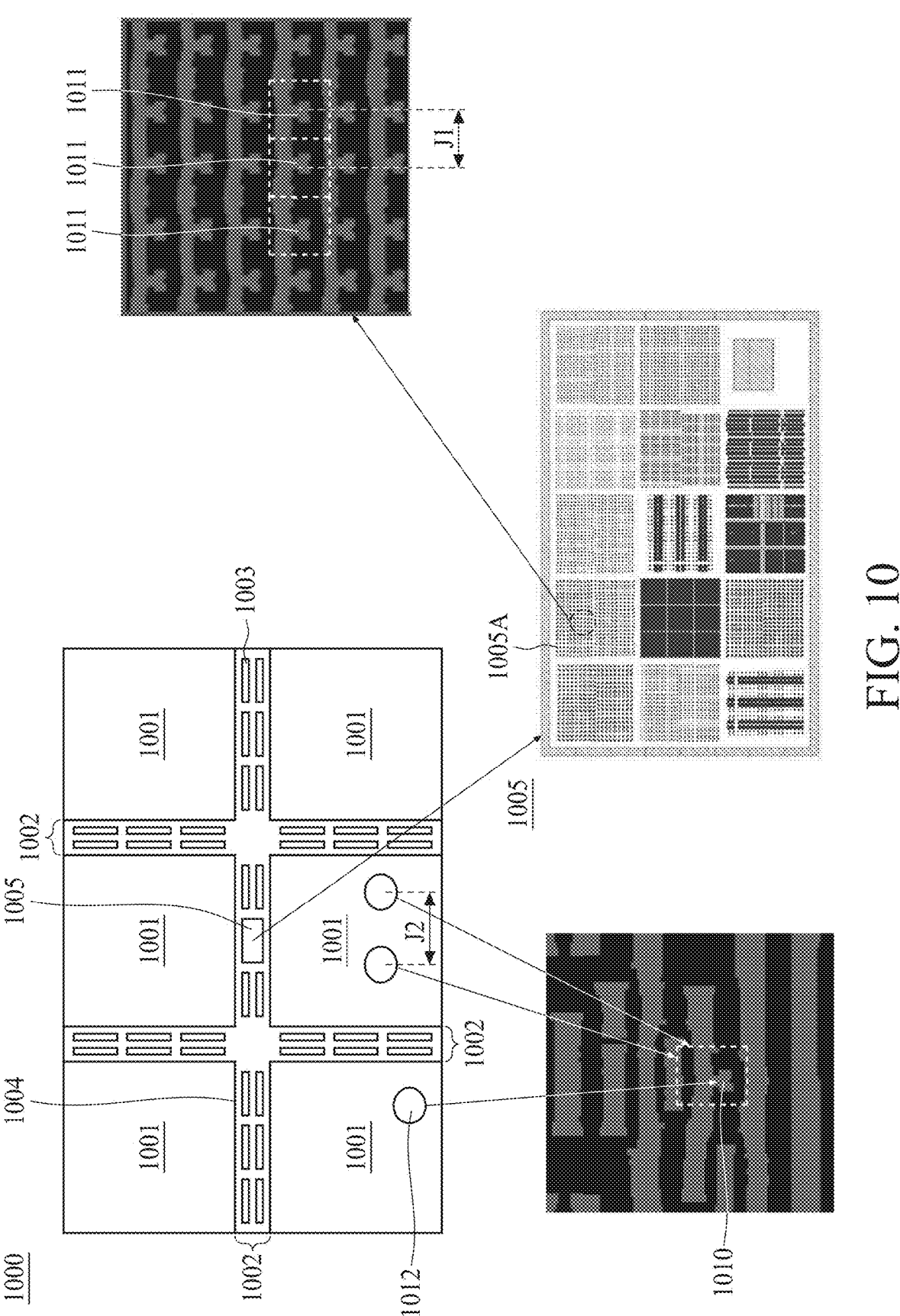
FIG. 10 is a schematic drawing showing a patterned surface of a photomask and enlarged views of dummy patterns, a training area, and pattern areas on the patterned surface of the photomask, according to some embodiments of the present disclosure.

Referring to FIG. 9 and FIG. 10, FIG. 9 shows a block diagram of a system for fabricating a photomask and performing inspection on the photomask, and FIG. 10 is schematic drawing showing a patterned surface of a photomask and enlarged views of dummy patterns, a training area, and pattern areas on the patterned surface of the photomask, according to some embodiments of the present disclosure. A photomask 1000 (a physical photomask, shown in FIG. 10) is fabricated based on a design database 901 input into the system 900 (operation 902). The photomask 1000 may include a substrate, an absorption layer, and/or one or more attenuating layers. The substrate may include fused silica, fused quartz, calcium fluoride, and/or other suitable material. The absorption layer may include chromium, MoSi, and/or other suitable materials. Typically, the mask pattern corresponding to a layout design 9011 of the design database 901 is etched into the absorption layer. This may be done using a mask writing technique such as electron beam writing, ion beam writing, etching such as wet or dry etching, or using an alternative mask writing technique. Attenuating layers may be formed that include such materials as metal silicide, metal nitride, iron oxide, inorganic material and/or other suitable materials. The photomask 1000 may further include one or more reflective layers. These reflective layers may be created using materials such as silicon/molybdenum, molybdenum/beryllium, and/or other suitable materials. As shown in FIG. 10, the photomask 1000 may include a plurality of pattern areas 1001, wherein each of the pattern areas 1001 may be separated and defined by a boundary 1004. In some embodiments, the pattern areas 1001 are separated by in-frame region 1002, wherein the in-frame region 1002 can be transferred to an area of an underlying substrate or wafer in a lithography operation, and the area can be utilized as a scribe line area where slicing operation can be performed along with the scribe lines. In some embodiments, dummy patterns 1003 can be disposed in the in-frame region 1002 in order to reduce local diffraction. Fabricating the photomask 1000 further includes forming the training area 1005 (operation 902A), as will be discussed subsequently in FIG. 11.

Figure 11:
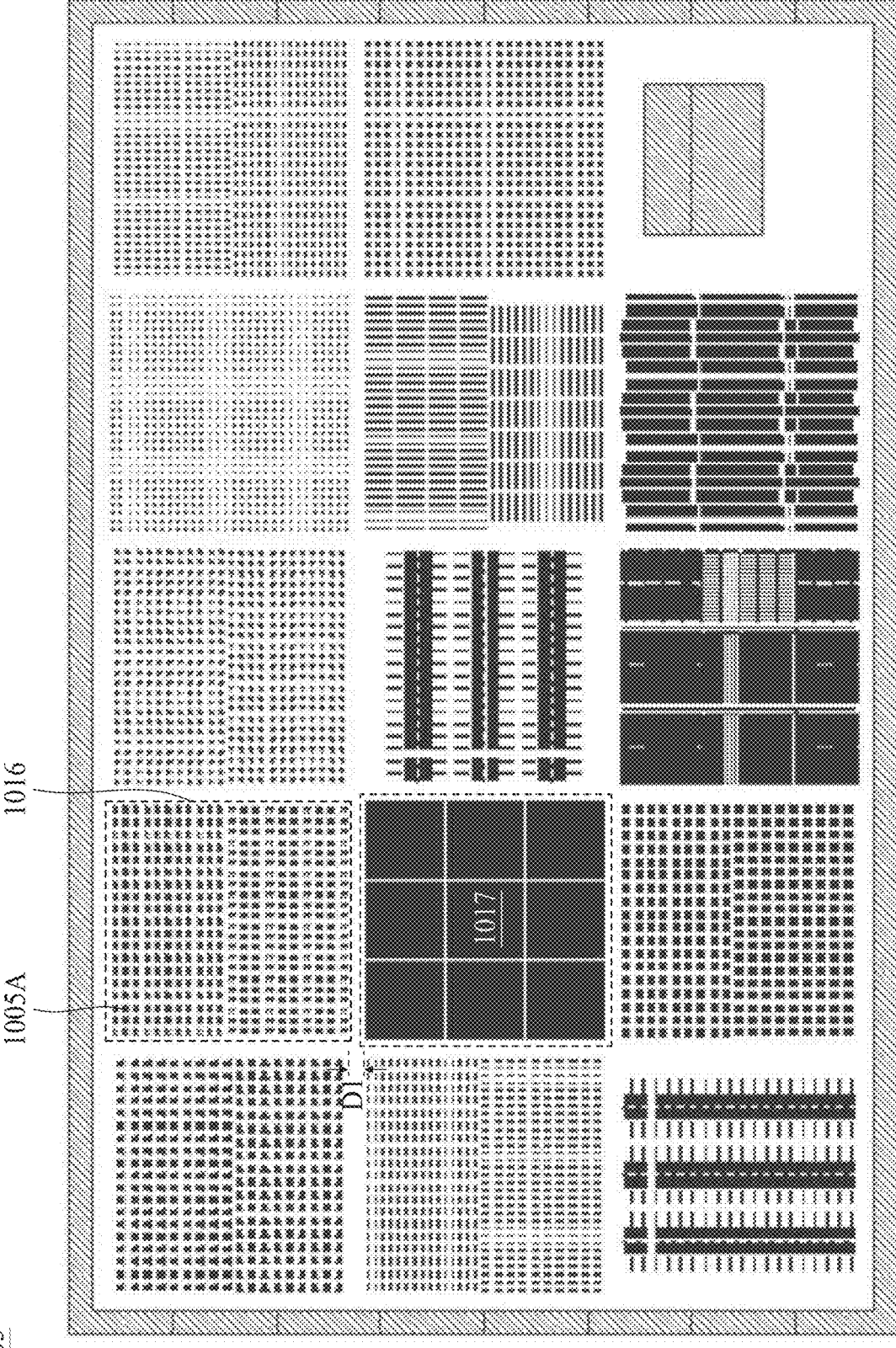
FIG. 11 is a schematic drawing showing an enlarged view of a training area on the patterned surface of the photomask, according to some embodiments of the present disclosure.

Referring to FIG. 10 to FIG. 11, FIG. 11 is a schematic drawing showing an enlarged view of a training area on the patterned surface of the photomask, according to some embodiments of the present disclosure. The mask 1000 further includes a training area 1005 at a same side of the pattern areas 1001. In some embodiments, the training area 1005 is adjacent to the pattern areas 1001, and may be free from overlapping with the pattern areas 1001. The pattern area 1001 at least include a first mask feature 1010, and the training area 1005 at least comprise a first training feature 1011, wherein the first training feature 1011 is comparable, or substantially similar, to the first mask feature 1010.

Figure 12:
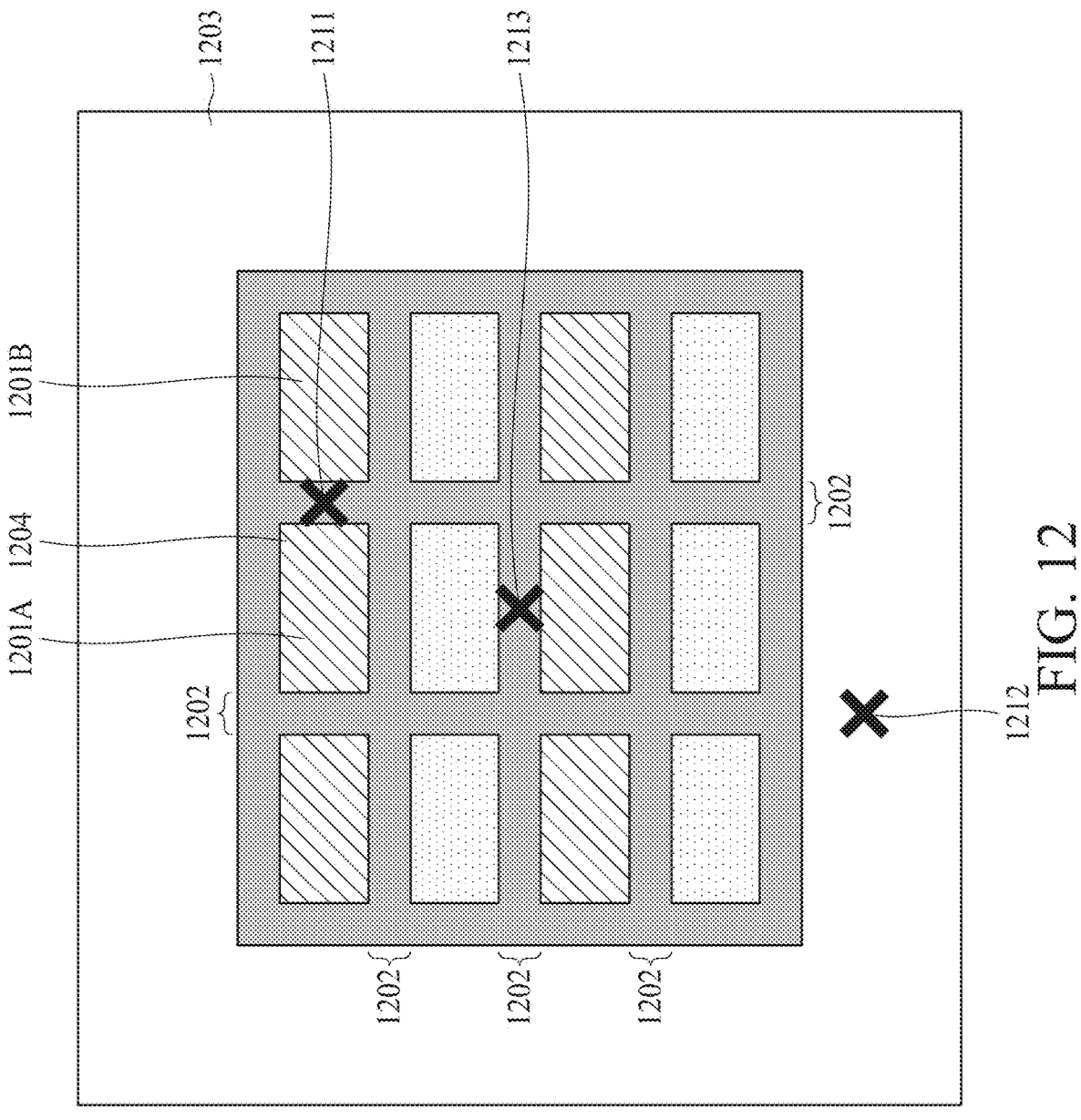
FIG. 12 is a schematic drawing showing a position of a training area on a patterned surface of a photomask, according to some embodiments of the present disclosure.

Referring to FIG. 10 and FIG. 12, FIG. 12 is a schematic drawing showing a position of a training area on a patterned surface of a photomask, according to some embodiments of the present disclosure. FIG. 12 shows an example of optical mask 1200, wherein the pattern areas are defined by boundaries 1204, and separated by in-frame region 1202. The training area 1005 may be formed in the in-frame region 1202 and between two pattern areas, for example, at a position 1211 between a first pattern area 1201A and a second pattern area 1201B, as shown in FIG. 12. Alternatively, the training area 1005 can also be formed at a position 1212 in a mask peripheral area 1203 (which can also referred to as out-frame area) surrounding the pattern areas (including 1201A, 1201B . . . ) and adjacent to an edge of the mask 1200. In some embodiments, a relative position 1212 and a center 1213 of the mask 1200 can be predetermined since it may be easier to scan the training area 1005 with optical device at a predetermined area, as will be discussed subsequently.

Figure 13:
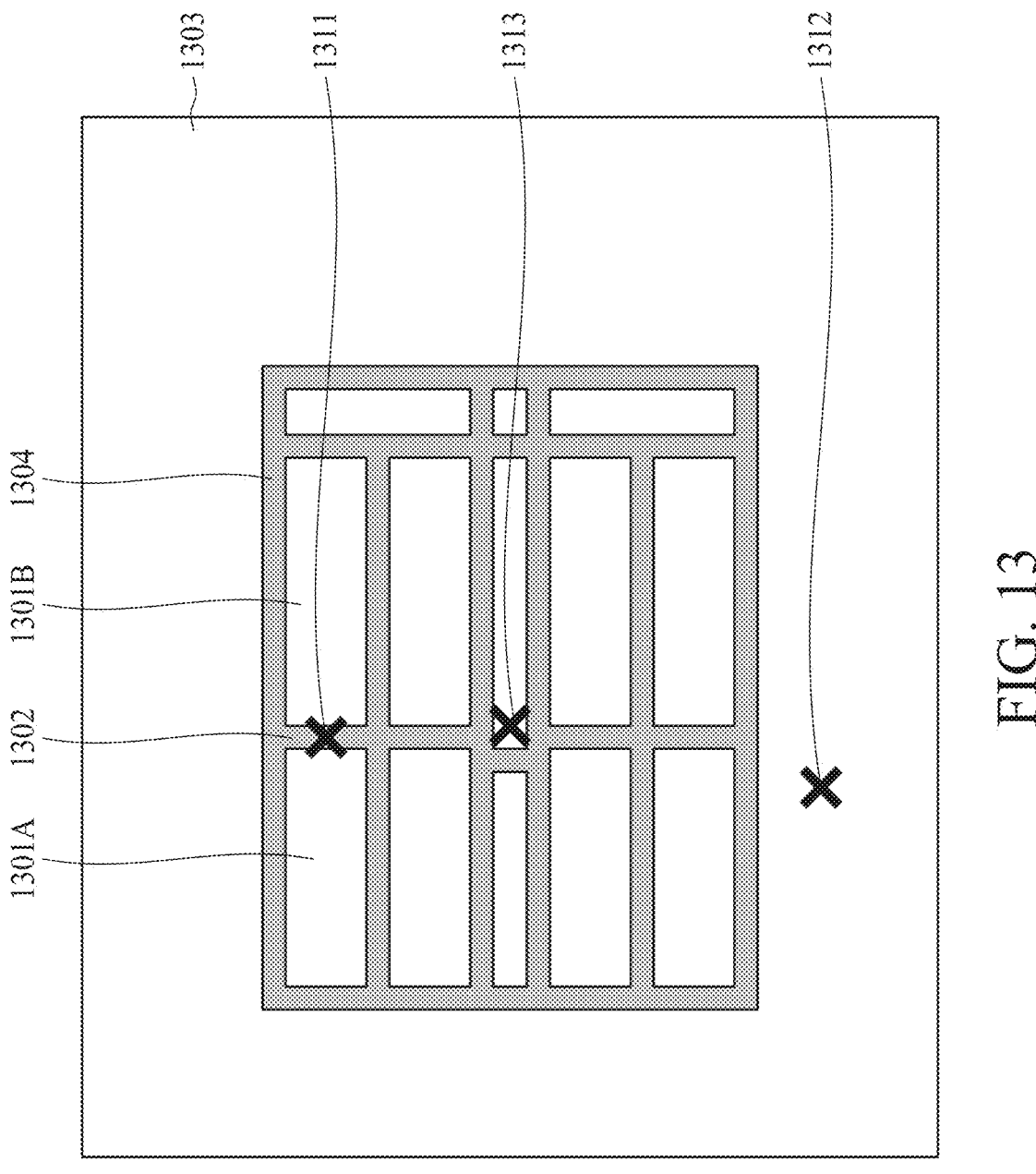
FIG. 13 is a schematic drawing showing a position of a training area on a patterned surface of a photomask, according to some embodiments of the present disclosure.

Referring to FIG. 10 and FIG. 13, FIG. 13 is a schematic drawing showing a position of a training area on a patterned surface of a photomask, according to some embodiments of the present disclosure. FIG. 13 shows an example of a reflective mask 1300 (such as EUV mask), wherein the pattern areas are defined by boundaries 1304, and separated by in-frame region 1302. The training area 1005 as shown in FIG. 10 and FIG. 0.11 may be formed in the in-frame region 1302 and between two pattern areas, for example, at a position 1311 between a first pattern area 1301A and a second pattern area 1301B, as shown in FIG. 13. Alternatively, the training area 1005 as shown in FIG. 10 and FIG. 0.11 can also be formed at a position 1312 in a mask peripheral area 1303 surrounding the pattern areas and adjacent to an edge of the mask 1300. In some embodiments, a relative position of the position 1312 and a center 1313 of the mask 1300 can be predetermined since it may be easier to scan the training area 1005 with optical device at a predetermined area, as will be discussed subsequently.

Referring back to FIG. 10, in some embodiments, the pattern area 1001 has two or more first mask features 1010, and the training area 1005 includes at least two first training features 1011. A first distance J1 between two adjacent first training features 1011 is less than or equal to a second distance J2 between two first mask features 1010. Alternatively stated, an arrangement of the first training features 1011 in the training area 1005 can be denser than an arrangement of the first mask features 1010 in the pattern area 1001. In some embodiments, the first training features 1011 is in a training pattern area 1005A, which may be defined by a training pattern area boundary 1016. The training area 1005 may include a plurality of training pattern areas 1005A, wherein each of the training pattern areas 1005A includes respective training features (comparable to other mask features in the pattern area 1001) repeatedly arranged and is defined by a training pattern area boundary 1016. In some embodiments, the training pattern areas 1005A are arranged in the training area 1005 in a form of an array or in a form of a row. For example, there may be 15 training pattern areas 1005A in the training area 1005. Optionally, each of the training pattern areas 1005A may be separated by a distance Dl.

Generally speaking, the first training features 1011 in the training area 1005 can be arranged in a repeated manner, such as in a form of an array or a row. Some examples of arrangement of the first training features 1011 (hereinafter respectively denoted as 1411, 1511, 1611) in the first training pattern area 1005A will be discussed in FIG. 14 to FIG. 16, and the effects of such configurations will be discussed subsequently.

Figure 14:
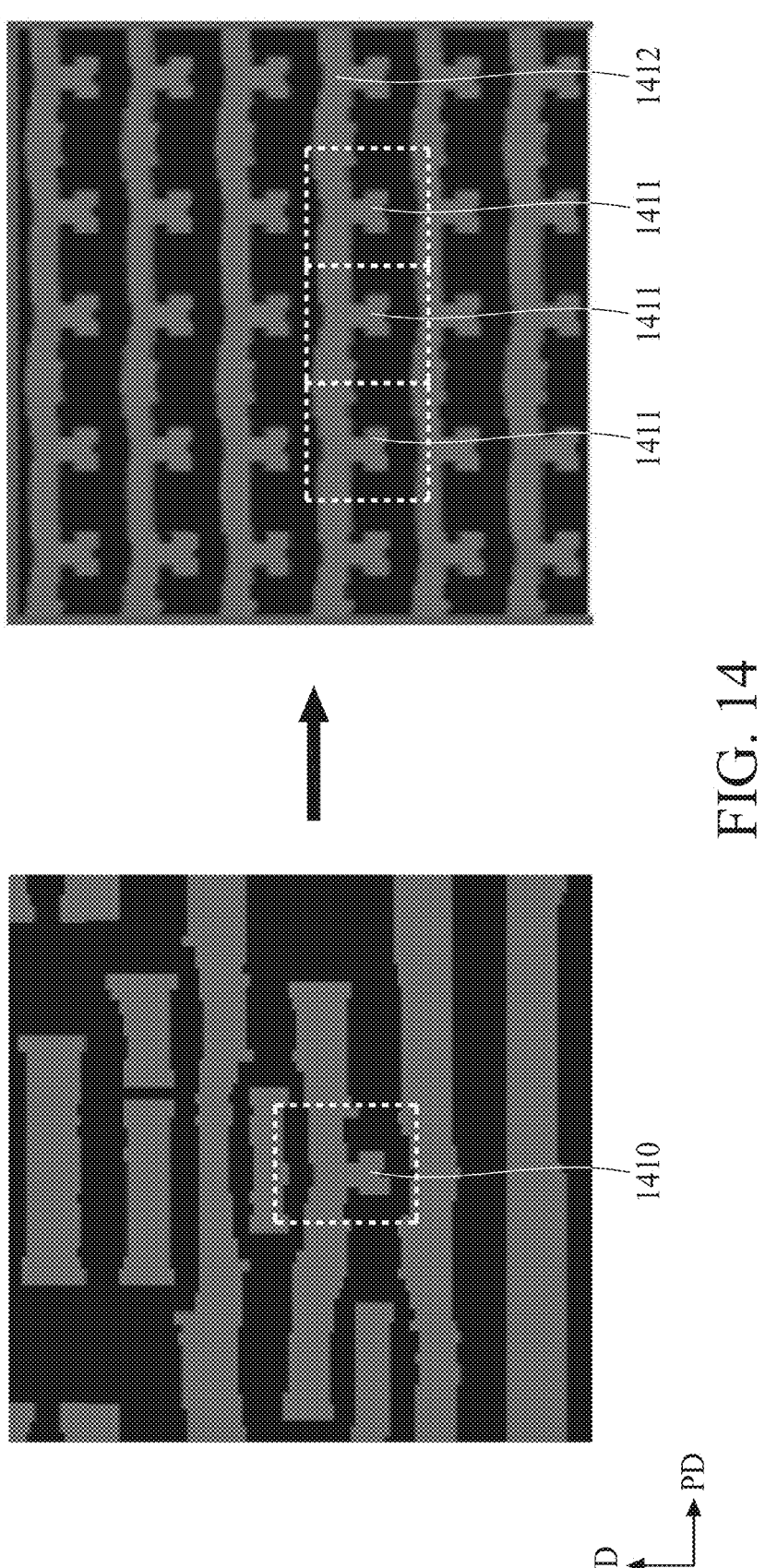
FIG. 14 is a schematic drawing showing a feature in a pattern area and a feature of a training area corresponding thereto, according to some embodiments of the present disclosure.

Referring to FIG. 14, FIG. 14 is a schematic drawing showing a feature in a pattern area and a feature of a training area corresponding thereto, according to some embodiments of the present disclosure. In the example provided in FIG. 14, the first training pattern area 1005A, as previously indicated in FIG. 11, includes at least one primary mask pattern 1412 and a plurality of the first training features 1411 (which corresponds to the first mask features 1410 in pattern area 1001), wherein the first training features 1411 are connected to the primary mask pattern 1412. In some of the embodiments, the primary mask pattern 1412 extends along a primary direction PD, wherein the first training features 1411 are connected to a same side of the primary mask pattern 1412 and arranged in a row. In some embodiments, a plurality of primary mask patterns 1412 can be repeatedly arranged along a secondary direction SD orthogonal to the primary direction PD, and each rows of the first training features 1411 are respectively arranged on a same side of each of the primary mask pattern 1412.

Figure 15:
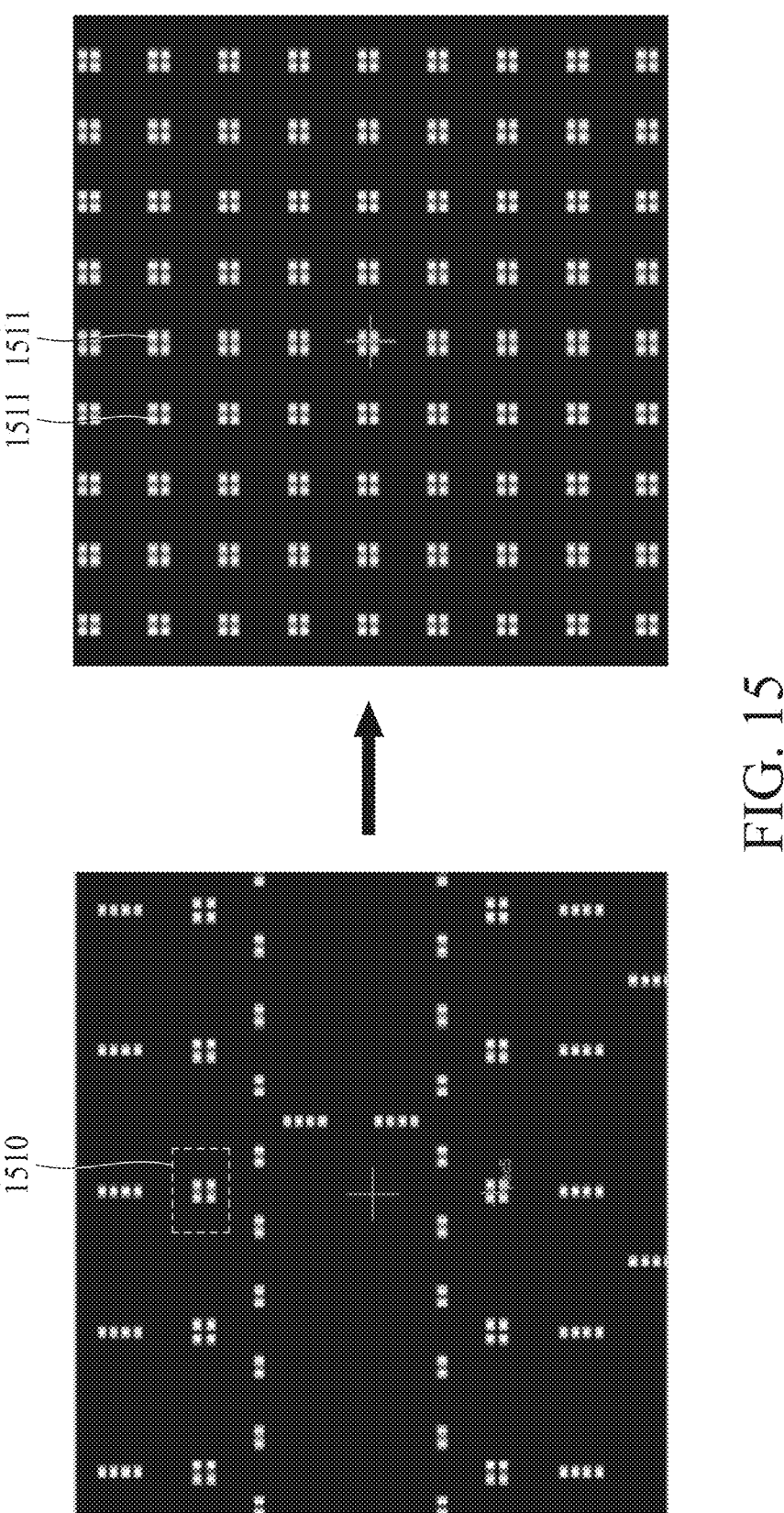
FIG. 15 is a schematic drawing showing a feature in a pattern area and a feature of a training area corresponding thereto, according to some embodiments of the present disclosure.

Referring to FIG. 15, FIG. 15 is a schematic drawing showing a feature in a pattern area and a feature of a training area corresponding thereto, according to some embodiments of the present disclosure. In the example provided in FIG. 15, a plurality of the first training features 1511 (which corresponds to the first mask features 1510 in pattern area 1001) are repeatedly arranged in a form of an array. Each of the first training features 1511 may be apart from another first training feature 1511.

Referring to FIG. 16, FIG. 16 is a schematic drawing showing a feature in a pattern area and a feature of a training area corresponding thereto, according to some embodiments of the present disclosure. In the example provided in FIG. 16, the first mask features 1610 are arranged in a form of an array 1613 in pattern area 1001 (shown in FIG. 10). Accordingly, a plurality of arrays 1614 (which includes a plurality of the first training features 1611 arranged in a form of array, wherein the first training features 1611 corresponds to the first mask features 1610) corresponding to the array 1613 is repeatedly arranged in a form of an array in the training area 1005 (shown in FIG. 10 to FIG. 11).

Generally speaking, by repeatedly arranging the training features corresponding to a targeted mask feature in the training area 1005, the light behavior that may occur at the targeted mask features in the pattern area 1001 may be more evident or more dominant, therefore, the image rendering model 9012 can be optimized through designed pre-swath calibration by utilizing the image derived from the training area 1005, and that may be applied to other pattern areas (even on other photomasks) that includes the targeted mask feature. Thus, the mask inspection operation can be optimized. The details of the designed pre-swath calibration and the mask inspection will be discussed subsequently.

Figure 17:
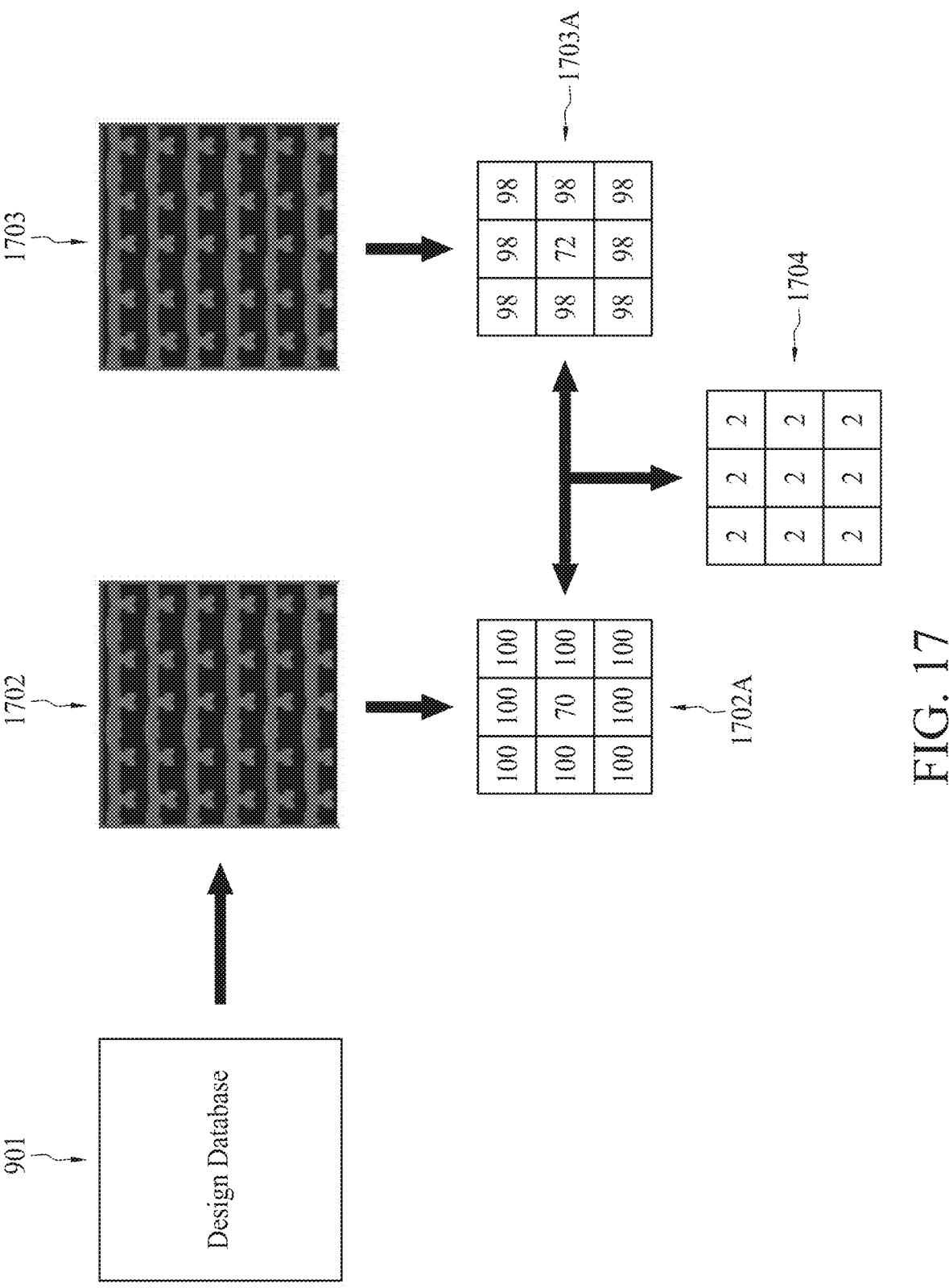
FIG. 17 shows a flow diagram of comparing a database training image and a mask training image, in accordance with some embodiments of the present disclosure.

Referring to FIG. 9 and FIG. 17, FIG. 17 shows a flow diagram of comparing a database training image and a mask training image, in accordance with some embodiments of the present disclosure. After fabricating the photomask 1000, which includes forming the first training pattern area 1005A, as previously shown in FIG. 10 and FIG. 11, in the pattern area 1001 (operation 902A), a portion of the first training pattern area 1005A including a plurality of the first training features (e.g. 1411, 1511, 1611) can be sampled by utilizing optical based system, that is, a mask training image

1703 can be obtained by capturing the image or scanning (e.g. by laser) the sampled portion of the photomask 1000 (operation 903). Alternatively stated, the mask training image 1703 is generated based on a portion of the photomask 1000. In some embodiments, a captured area of the first training pattern area 1005A (that is, the coverage of the mask training image 1703) has a size smaller than an area of the first training pattern area 1005A. For example, the first training pattern area 1005A has a width in a range from about 50 μm, and a width of the captured area of the first training pattern area 1005A is in a range from about 25.6 μm to about 38.4 μm (but the present disclosure is not limited thereto).

Since the behaviors of light such as diffraction, fringing and interference become more significant, it becomes more and more difficult to directly simulate light behaviors based on old data or past experience. Therefore, a designed pre-swath calibration is performed after a database training image 1702 is generated based on the design database 901 (operation 904), wherein the database training image 1702 has a pattern corresponding and similar to the mask training image 1703, and may undergone image rendering operation by the image rendering model 9012. By comparing between the database training image 1702 and the mask training image 1703, the database training image 1702 can be adjusted (automatically or manually) as to be aligned with the mask training image 1703. Herein the mask training image 1703 can serve as a baseline of designed pre-swath calibration for adjusting the design database 901. The method of comparing between the database training image 1702 and the mask training image 1703 provided in FIG. 17 can be referred to the method of die-to-database comparison discussed in FIG. 7. Specifically, the database training image 1702 and the mask training image 1703 are respectively converted into a first gray scale mapping 1702A and a second gray scale mapping 1703A, and a comparison mapping 1704 can be generated based on a result of comparison between the first gray scale mapping 1702A and the second gray scale mapping 1703A. The comparison mapping 1704 can serve as an indication of similarity between the first gray scale mapping 1702A and the second gray scale mapping 1703A, and may also serve as an indication of similarity between the initial database image 1702 and the mask image 1703. When at least a portion among all pixels in the comparison mapping 1704 has a value less than a threshold value, then two compared gray scale mappings can be deemed similar and the initial database image 1702 can be deemed passable. In some alternative embodiments, the mask training image 1703 can also be adjusted by graphic processing prior to or during designed pre-swath calibration.

A pass/fail determination operator 906 (shown in FIG. 9) performs a determination operation to assess the similarity between the database training image 1702 and the mask training image 1703. For example, when 90% or more of the pixels of the comparison mapping 1704 has a value less than 50 on the 0 to 255 scale, the two compared gray scale mappings can be deemed similar or acceptable (the design database 901 being deemed passable) by the pass/fail determination operator 906 (Y path). It should be noted that the threshold value and the scale is not limited thereto in the present disclosure. The setting of the design database 901 is saved when the database training image 1702 and the mask training image 1703 are deemed similar (operation 907).

On the other hand, when two gray scale mappings are deemed not similar or failed (e.g. less than 90% of the pixels of the comparison mapping 1704 has a value less than 50 in the 0 to 255 scale) by the pass/fail determination operator 906 (N path, which is presented in dotted lines in FIG. 9), the image rendering model 9012 of the design database 901 would then be adjusted as an adjusted design database 901A in order to generate an adjusted database training image 1702 (operation 904A, shown in FIG. 9) and further compared to the mask training image 1703 (operation 905A, similar to previously discussed operation 905 or 405 in FIG. 4), wherein a new grayscale mapping of the adjusted database image 1702 is generated and compared to the second gray scale mapping 1703A. In some alternative embodiments, the database training image 1702 and/or the mask training image 1703 can be adjusted manually or automatically by graphic processing to increase the similarity thereof to eliminate potential false-positive defects identified in subsequent inspection operations, until the database training image 1702 or the mask training image 1703 are deemed similar by the pass/fail determination operator 906. The setting of the adjusted design database 901A is saved when the database training image 1702 and the mask training image 1703 are deemed similar (operation 907).

As previously discussed, by repeatedly arranging the training features 1011 (such as 1411 in FIG. 14, 1511 in FIG. 15, 1611 in FIG. 16) corresponding to a first mask feature 1010 (such as 1410 in FIG. 14, 1510 in FIG. 15, 1610 in FIG. 16) in the training area 1005, the light behavior that may occur at the targeted first mask features 1010 in the pattern area 1001 may be more evident or more dominant. Thereby, the learning of the light behaviors at the targeted first mask features 1010 for the image rendering model 9012 can be more efficient, and the image rendering model 9012 can render the targeted first mask features 1010 with optimized calculation, thereby can generate a database training image 1702 more similar to the mask training image 1703. The optimized image rendering model 9012 can also be applied to other pattern areas (even on other photomasks) that includes the targeted mask feature. In some cases, it can further be applied to a same/similar targeted mask feature but placed in a pattern area different to the pattern area 1001. Thus, the accuracy of mask inspection operation can be optimized. By performing the aforesaid designed pre-swath calibration operation, the aforesaid system 900 may, as a precaution, help eliminating potential falsely identified defects that are generated due to the limitation of the ability of the image rendering model 9012.

In some embodiments, the designed pre-swath calibration can be performed multiple times by utilizing different training features in different training pattern areas 1005A, which may help eliminating more potential false-positive defects as a precaution. For example, another training pattern area 1005A include a training features 1017 different from the training features 1011, wherein one of the pattern area 1001 includes a mask feature 1012 comparable to the training features 1017. For example, in the case of having 15 training pattern areas 1005A in the training area 1005, each of the training pattern areas 1005A can be utilized in designed pre-swath calibration. All of the passable settings can be saved in a library in the design database 901 so the settings can be utilized in further inspections.

A die-to-database comparison operation (operation 915, which may be similar to operation 405 in FIG. 4, 905 in FIG. 9, or 905A in FIG. 9 as previously discussed) can be performed after generating an initial database image (operation 914) based on the optimized image rendering model 9012 of the adjusted design database 901A (or designed database 901) and obtaining a mask image of the fabricated mask (operation 913, which may be similar to operation 403 discussed in FIG. 4). Subsequently, by comparing between the mask image of the fabricated mask and the initial database image, the difference thereof can be identified, wherein at least a portion of (or most) remaining can be deemed as defects to be repaired in some cases. The remaining defects pending for manual review (operation 916) can be significantly reduced in some of the cases comparing to not performing designed pre-swath calibration.

Some of the mask patterns may not be rendered accurately due to the limitation of the aggressive optical proximity correction (OPC), inverse lithography technology (ILT), and/or source mask optimization (SMO). In order to optimize the image rendering model and the inspection operation to comply with complicated design rules of mask patterns, the present disclosure provides a photomask, a method for fabricating a photomask, and method for inspecting photomask.

A method of inspecting a photomask including pre-swath calibration is discussed in FIG. 2 to FIG. 7. By utilizing a technique of converting the initial database image 302 (or adjusted database image 304) and the mask image 303 into grayscale mappings, the die-to-database comparison (operation 405 or 405A) can be performed automatically and may be more accurately. A result of the die-to-database comparison can be utilized as a baseline of pre-swath calibration. By adjusting the initial database image 302 (and/or the mask image 303 in some cases), the initial database image 302 can be modified to be similar to the mask image 303. Therefore, the design database 401 can save the settings with regard to the updated database image as the baseline of photomask inspection on same/similar mask feature, and the related image rendering model can be optimized. The false-positive defects can be reduced as a precaution comparing to not performing pre-swath calibration. The adjusted design database 401A optimized from the design database 401 can further be utilized in inspecting other photomasks.

A method of inspecting a photomask including designed pre-swath calibration is discussed in FIG. 8A to FIG. 17. Complicated pattern, pattern under new design rule or patterns that often cause false-positive defects during inspection are targeted. In order to optimize the design database 901 and its image rendering model, a training area 1005 as disposed on a physical photomask. The training area 1005 includes training pattern 1011 (such as 1411 in FIG. 14, 1511 in FIG. 15, 1611 in FIG. 16) that is comparable to the aforesaid targeted first mask feature 1010 (such as 1410 in FIG. 14, 1510 in FIG. 15, 1610 in FIG. 16). In order to simulate the light behavior around the targeted first mask feature 1010 with enhanced accuracy, a plurality of the training patterns 1011 are arranged in a dense and repeated arrangement in order to make the light behavior more apparent. Similar to the pre-swath calibration, by utilizing a technique of converting the database training image 1702 and the mask training image 1703 into grayscale mappings, the die-to-database comparison (operation 905 or 905A) can be performed automatically and may be more accurately. A result of the die-to-database comparison can be utilized as a baseline of designed pre-swath calibration. By adjusting the database training image 1702 (and/or the mask training image 1703 in some cases), the database training image 1702 can be modified to be similar to the mask training image 1703. Therefore, the design database 901 can save the settings with regard to the updated database image as the baseline of photomask inspection on same/similar mask feature, and the related image rendering model can be optimized. The designed pre-swath calibration may be optimized since the light behavior can be simulated in a more accurate manner. Thereby, the learning of the light behaviors at the targeted first mask features 1010 for the image rendering model 9012 can be more efficient, and the image rendering model 9012 can render the targeted first mask features 1010 with optimized calculation. The optimized image rendering model 9012 can also be applied to other pattern areas that includes the targeted mask feature. In some cases, it can further be applied to a same/similar targeted mask feature but placed in a pattern area different to the pattern area 1001. By performing the aforesaid designed pre-swath calibration operation, the aforesaid system 900 may, as a precaution, help eliminating potential falsely identified defects that are generated due to the limitation of the ability of the image rendering model 9012.

The methods and the structures of the photomasks can be applied to various types of photomasks and various types of lithography operations, such as attenuated phase-shift mask (AttPSM), super binary mask (SBIM), alternating phase-shift mask (AltPSM), binary mask, EUV mask, DUV mask, or other types of optical masks. The techniques may also be applied to inspecting a wafer, a substrate, or a semiconductor structure that requires optimized inspection operations.

Some embodiments of the present disclosure provide a photomask, including a plurality of pattern areas, each of the pattern areas is defined by a respective boundary, a first pattern area including a first mask feature, and a training area adjacent to a boundary of the pattern area, the training area comprising a first training feature, wherein the first training feature is comparable to the first mask feature.

Some embodiments of the present disclosure provide a method for inspecting a photomask, including receiving a first design database, generating a database training image based on the first design database, obtaining a mask training image by scanning a training area of a photomask, comparing the database training image and the mask training image, generating a second design database based on a result of comparing the database training image and the mask training image, and comparing a mask feature in a pattern area of the photomask and the an initial database image derived from the second design database.

Some embodiments of the present disclosure provide a method for inspecting a photomask, including: receiving a first design database, receiving a mask image of a photomask fabricated based on the first design database, generating a first database image based on the first design database, comparing the first database image and the mask image, and generating a second design database based on a result of comparing the first database image and the mask image by adjusting the first design database.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for inspecting a photomask, comprising:
receiving a first design database;
generating a database training image based on the first design database;
obtaining a mask training image by scanning one of a plurality of training areas of a photomask, wherein a training feature on the training areas of the photomask is substantially similar to a mask feature in one of a plurality of pattern areas of the photomask, and the training feature on the training areas of the photomask comprises: an array of repeating training features arranged in a row, wherein a pattern of the array of repeating training features is configured to be transferred to a scribe line of a substrate;
comparing the database training image and the mask training image;
generating a second design database based on a result of comparing the database training image and the mask training image;
obtaining a mask image by scanning the mask feature in the one of the plurality of pattern areas of the photomask; and
comparing the mask image and an initial database image derived from the second design database,
wherein a first training area of the training areas is formed in an in-frame region of the photomask and a second training area of the training areas is formed at a center of the photomask, which is outside the in-frame region and surrounded by the plurality of pattern areas, and the plurality of pattern areas arranged in rows and columns are separated by the in-frame region.

2. The method of claim 1, wherein comparing the database training image and the mask training image comprises:
generating a first gray scale mapping of the database training image;
generating a second gray scale mapping of the mask training image; and
comparing the first gray scale mapping and the second gray scale mapping.

3. The method of claim 2, wherein comparing the first gray scale mapping and the second gray scale mapping comprises: generating a difference mapping of a difference between corresponding mapping pixels of the first gray scale mapping and the second gray scale mapping, and comparing a value corresponding to each pixels of the difference mapping to a threshold value.

4. The method of claim 1, further comprising determining pass or fail of the first design database based on the result of comparing the database training image and the mask training image.

5. The method of claim 1, further comprising:
generating an adjusted database training image based on the second design database;
comparing the adjusted database training image and the mask training image;
determining pass or fail of the second design database; and adjusting the second design database when the second design database fails, or saving the second design database when the second design database passes.

6. The method of claim 1, further comprising adjusting the mask training image prior to comparing the database training image and the mask training image.

7. A method for inspecting a photomask, comprising:

receiving a first design database;

receiving a first mask image of one of a plurality of training areas of a photomask fabricated based on the first design database, wherein a training feature on the training areas of the photomask is substantially similar to a mask feature in one of a plurality of pattern areas of the photomask, and the training feature is configured to be transferred to a scribe line of a substrate;

generating a first database image based on the first design database;

comparing the first database image and the first mask image;

generating a second design database based on a result of comparing the first database image and the first mask image by adjusting the first design database;

generating a second database image based on the second design database; and comparing the second database image and a second mask image corresponding to the mask feature in the pattern area of the photomask, wherein a first training area of the training areas is formed in an in-frame region of the photomask and a second training area of the training areas is formed at a center of the photomask, which is outside the in-frame region and located in one of the plurality of pattern areas, and the plurality of pattern areas arranged in rows and columns are separated by the in-frame region.

8. The method of claim 7, wherein comparing the first database image and the first mask image comprises:

generating a first gray scale mapping of the first database image;

generating a second gray scale mapping of the first mask image; and comparing the first gray scale mapping and the second gray scale mapping.

9. The method of claim 8, wherein generating the second design database based on the result of comparing the first database image and the first mask image by adjusting the first design database comprises:

using the first mask image as a baseline of pre-swath calibration to adjust the first design database.

10. The method of claim 8, further comprising:

generating a third gray scale mapping of the second database image, wherein each of the second gray scale mapping and the third gray scale mapping comprises a plurality of mapping pixels;

determining a gray scale value corresponding to each of the mapping pixels of the second gray scale mapping;

determining a gray scale value corresponding to each of the mapping pixels of the third gray scale mapping; and comparing the third gray scale mapping with the second gray scale mapping, wherein a difference mapping of a difference between corresponding mapping pixels of the second gray scale mapping and the third gray scale mapping is received.

11. A method for inspecting a photomask, comprising:

fabricating a photomask, wherein the photomask comprises:

a plurality of pattern areas, wherein each of the pattern areas is defined by a respective boundary, and a first pattern area comprises a first mask feature; and a plurality of training areas, the training area comprising a first training feature, wherein the first training feature is substantially similar to the first mask feature, and the first training pattern is configured to be transferred to a scribe line of a substrate;

obtaining a mask training image by scanning one of the training areas of the photomask;

receiving a design database;

generating a database training image based on the design database;

comparing the database training image and the mask training image;

adjusting the design database based on a result of comparing the database training image and the mask training image;

generating an initial database image based on the adjusted design database;

obtaining a mask image by scanning the first pattern area of the photomask; and comparing the initial database image and the mask image, wherein a first training area of the training areas is formed between two adjacent pattern areas of the plurality of pattern areas, and a second training area of the training areas is formed in one of the plurality of pattern areas other than the two adjacent pattern areas.

12. The method of claim 11, wherein the photomask comprises a second pattern area adjacent to the first pattern area, wherein the one of the training areas is between the first pattern area and the second pattern area.

13. The method of claim 11, wherein the one of the training areas comprises a plurality of the first training features repeatedly arranged in a form of an array.

14. The method of claim 11, wherein the one of the training areas comprises at least two first training features and the first pattern area comprises at least two first mask features, wherein a first distance between two of the first training features is less than a second distance between two of the first mask features.

15. The method of claim 11, wherein the one of the training areas comprises a first primary mask pattern extending along a primary direction, and a plurality of the first training features are connected by the primary mask pattern.

16. The method of claim 15, wherein the plurality of the first training features are arranged on a side of the primary mask pattern.

17. The method of claim 11, wherein the first pattern area further comprises a second mask feature different from the first mask feature, and the one of the training areas further comprises a second training feature comparable to the second mask feature.

18. The method of claim 11, wherein the photomask further comprises a plurality of training pattern areas, each of the training pattern areas comprising respective training features repeatedly arranged in a form of an array.

19. The method of claim 1, wherein the second training area is located in one of the plurality of pattern areas arranged in the central row of the rows.

20. The method of claim 1, wherein the second training area is located in one of the plurality of pattern areas arranged in the narrowest row of the rows.

* * * * *